US010686428B2

(12) United States Patent
Guo et al.

(10) Patent No.: US 10,686,428 B2
(45) Date of Patent: Jun. 16, 2020

(54) CELL OF TRANSMISSION GATE FREE CIRCUIT AND INTEGRATED CIRCUIT LAYOUT INCLUDING THE SAME

(71) Applicant: TAIWAN SEMICONDUCTOR MANUFACTURING CO., LTD., Hsinchu (TW)

(72) Inventors: Ta-Pen Guo, Taipei (TW); Chi-Lin Liu, New Taipei (TW); Shang-Chih Hsieh, Yangmei (TW); Jerry Chang-Jui Kao, Taipei (TW); Li-Chun Tien, Tainan (TW); Lee-Chung Lu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/204,932

(22) Filed: Nov. 29, 2018

(65) Prior Publication Data

US 2019/0173456 A1 Jun. 6, 2019

Related U.S. Application Data

(62) Division of application No. 15/841,950, filed on Dec. 14, 2017, now Pat. No. 10,270,430.
(Continued)

(51) Int. Cl.
*H03K 3/356* (2006.01)
*H03K 3/0233* (2006.01)
(Continued)

(52) U.S. Cl.
CPC ..... *H03K 3/02332* (2013.01); *H01L 27/0207* (2013.01); *H01L 27/0233* (2013.01);
(Continued)

(58) Field of Classification Search
CPC ........ H01L 2924/00; H01L 2924/00014; B41J 2/04541; B41J 2/04543
See application file for complete search history.

(56) References Cited

U.S. PATENT DOCUMENTS 6,144,241 A 11/2000 Wong
7,919,792 B2 4/2011 Law et al.
(Continued)

FOREIGN PATENT DOCUMENTS

CN 101752368 A 6/2010
CN 103828059 A 5/2014
(Continued)

*Primary Examiner* — Sibin Chen
(74) *Attorney, Agent, or Firm* — McDermott Will & Emery LLP

(57) ABSTRACT

A semiconductor standard cell of a flip-flop circuit includes semiconductor fins extending substantially parallel to each other along a first direction, electrically conductive wirings disposed on a first level and extending substantially parallel to each other along the first direction, and gate electrode layers extending substantially parallel to a second direction substantially perpendicular to the first direction and formed on a second level different from the first level. The flip-flop circuit includes transistors made of the semiconductor fins and the gate electrode layers, receives a data input signal, stores the data input signal, and outputs a data output signal indicative of the stored data in response to a clock signal, the clock signal is the only clock signal received by the semiconductor standard cell, and the data input signal, the clock signal, and the data output signal are transmitted among the transistors through at least the electrically conductive wirings.

20 Claims, 17 Drawing Sheets

Related U.S. Application Data

(60) Provisional application No. 62/439,742, filed on Dec. 28, 2016.

(51) Int. Cl.
*H03K 23/58* (2006.01)
*H03K 19/094* (2006.01)
*H03K 3/01* (2006.01)
*H01L 27/02* (2006.01)
*H03K 3/3562* (2006.01)
*H01L 27/118* (2006.01)
*H01L 27/092* (2006.01)
*H01L 27/12* (2006.01)

(52) U.S. Cl.
CPC .... *H01L 27/0924* (2013.01); *H01L 27/11807* (2013.01); *H03K 3/01* (2013.01); *H03K 3/35625* (2013.01); *H03K 3/356121* (2013.01); *H03K 19/094* (2013.01); *H03K 23/58* (2013.01); *H01L 27/1211* (2013.01); *H01L 2027/11875* (2013.01); *H01L 2027/11879* (2013.01)

(56) References Cited

U.S. PATENT DOCUMENTS

| | | |
|---|---|---|
| 8,173,491 B2 | 5/2012 | Law et al. |
| 8,595,661 B2 | 11/2013 | Kawa et al. |
| 8,924,908 B2 | 12/2014 | Kawa et al. |
| 9,076,673 B2 | 7/2015 | Kawa et al. |
| 9,158,886 B1 | 10/2015 | Chen |
| 9,584,099 B2 | 2/2017 | Liu et al. |
| 9,641,160 B2 | 5/2017 | Agarwal et al. |
| 9,691,764 B2 | 6/2017 | Kawa et al. |
| 2010/0155783 A1 | 6/2010 | Law et al. |
| 2011/0177658 A1 | 7/2011 | Law et al. |
| 2013/0026572 A1 | 1/2013 | Kawa et al. |
| 2014/0054722 A1 | 2/2014 | Kawa et al. |
| 2014/0183646 A1* | 7/2014 | Hatamian ........... G06F 17/5081 257/369 |
| 2015/0116019 A1 | 4/2015 | Hsu et al. |
| 2015/0137256 A1 | 5/2015 | Kawa et al. |
| 2015/0303196 A1 | 10/2015 | Kawa et al. |
| 2016/0043083 A1 | 2/2016 | Kawa et al. |
| 2016/0065184 A1* | 3/2016 | Liu ........................ H03K 3/037 327/225 |
| 2016/0261252 A1 | 9/2016 | Agarwal et al. |
| 2016/0300839 A1* | 10/2016 | Kim .................... H01L 27/0924 |

FOREIGN PATENT DOCUMENTS

| | | |
|---|---|---|
| TW | 201310617 A | 3/2013 |
| TW | 201300988 A | 1/2016 |
| TW | 201642588 A | 12/2016 |

* cited by examiner

CELL OF TRANSMISSION GATE FREE CIRCUIT AND INTEGRATED CIRCUIT LAYOUT INCLUDING THE SAME

PRIORITY CLAIM AND CROSS-REFERENCE

This application is a divisional application of U.S. application Ser. No. 15/841,950 filed Dec. 14, 2017, which claims priority to U.S. Provisional Application No. 62/439,742 filed Dec. 28, 2016, entitled "TRANSMISSION GATE FREE FLOPS DESIGN FOR REDUCING CELL HEIGHT," the entire disclosure of each which is incorporated herein by reference.

BACKGROUND

Today, integrated circuits can include many standard cells with different functions. For example, standard cells can be logic gates, such as an AND gate, an OR gate, an XOR gate, a NOT gate, a NAND gate, a NOR gate, and an XNOR gate, and combinational logic circuits such as a multiplexer, a flip-flop, an adder, and a counter. Standard cells can be implemented to realize complex integrated circuit functions. When designing an integrated circuit having specific functions, standard cells are selected. Next, designers, or EDA (Electronic Design Automation) or ECAD (Electronic Computer-Aided Design) tools draw out design layouts of the integrated circuit including the selected standard cells and/or non-standard cells. The design layouts are converted to photomasks. Then, semiconductor integrated circuits can be manufactured, when patterns of various layers, defined by photography processes with the photomasks, are transferred to a substrate.

For convenience of integrated circuit design, a library including frequently used standard cells with their corresponding layouts are established. Therefore, when designing an integrated circuit, a designer can select desired standard cells from the library and places the selected standard cells in an automatic placement and routing block, such that a layout of the integrated circuit can be created.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
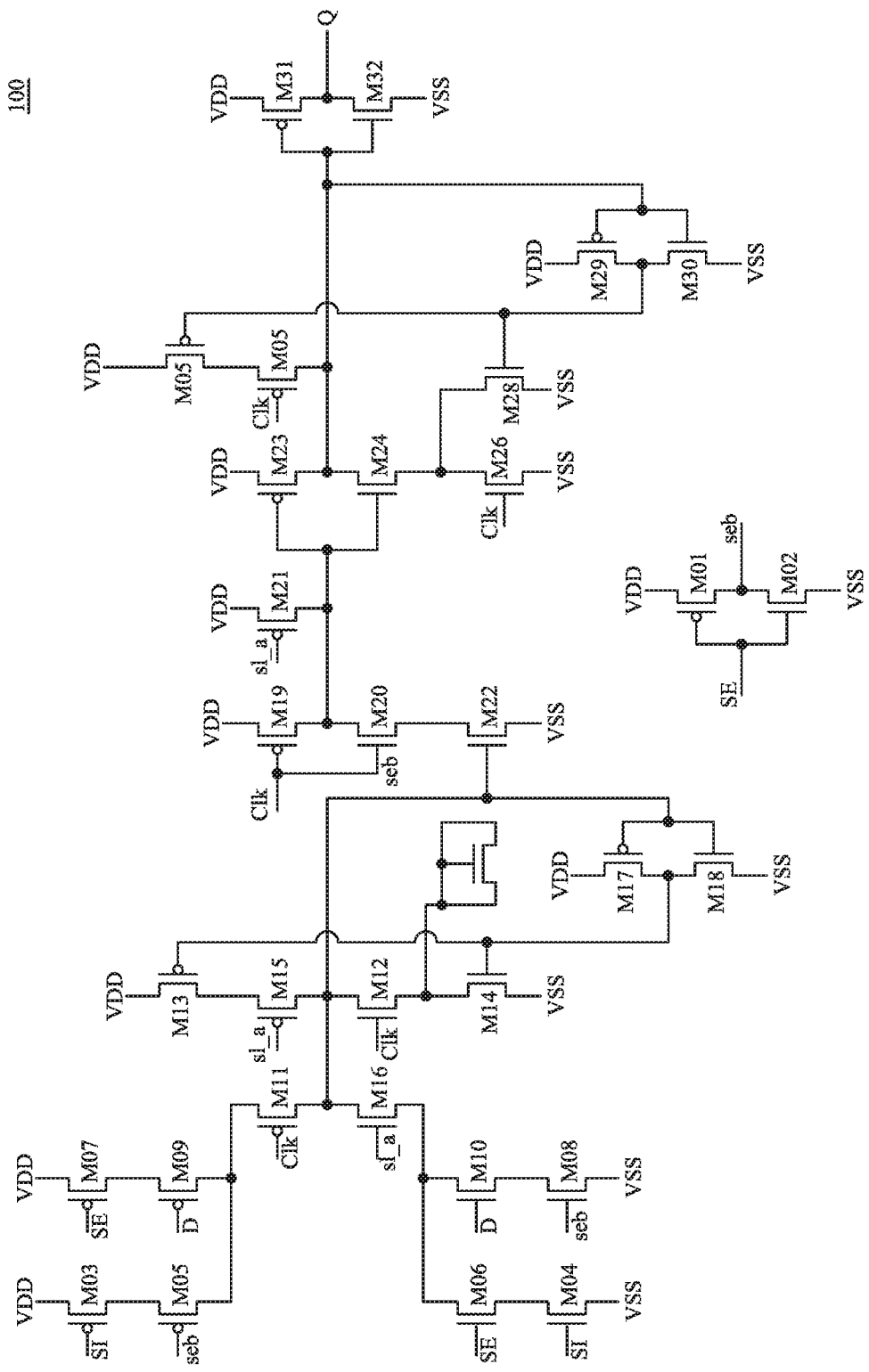
FIG. 1 shows a circuit diagram of a flip-flop circuit, a standard cell layout of which is shown in FIGS. 2 and 3, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the present disclosure, a layer, a pattern, or a structure extending in one direction means that a dimension of the layer, the pattern, or the structure in the extended one direction is greater than another dimension of the layer, the pattern, or the structure in another dimension substantially perpendicular to the extended one direction.

It should be understood that in the present disclosure, one pattern/layer/structure/surface/direction being substantially perpendicular to another pattern/layer/structure/surface/direction means that the two patterns/layers/structures/surfaces/directions are perpendicular to each other, or the two patterns/layers/structures/surfaces/directions are intended to be configured to be perpendicular to each other but may not be perfectly perpendicular to each other due to design, manufacturing, measurement errors/margins caused by unperfected manufacturing and measurement conditions. Such a description should be recognizable to one of ordinary skill in the art.

It should be understood that in the present disclosure, one pattern/layer/structure/surface/direction being substantially parallel to another pattern/layer/structure/surface/direction means that the two patterns/layers/structures/surfaces/directions are parallel to each other, or the two patterns/layers/structures/surfaces/directions are intended to be configured to be parallel to each other but may not be perfectly parallel to each other due to design, manufacturing, measurement errors/margins caused by unperfected manufacturing and measurement conditions. Such a description should be recognizable to one of ordinary skill in the art.

In the present disclosure, layers/patterns/structures being formed of substantially the same material means that the layers/patterns/structures are formed of the same material or the layers/patterns/structures are originally formed of the same material but can have impurities having the same or different types with the same or different concentrations doped later in order to implement a semiconductor device. Such a description should be recognizable to one of ordinary skill in the art.

In the present disclosure, two layers/patterns/structures being formed on a same level means that the two layers/patterns/structures have a same distance from a reference plane, for example, a surface of a substrate, based on which a semiconductor device is formed, or the two layers/patterns/structures are intended to be configured to have a same distance from a reference plane, for example, a surface of a substrate, based on which a semiconductor device is formed but may not be perfectly have the same distance from the reference plane due to design, manufacturing, measurement errors/margins caused by unperfected manufacturing and measurement conditions. Such a description should be recognizable to one of ordinary skill in the art.

In the present disclosure, two layers/patterns/structures being formed on different level means that with consideration of variations/errors caused by, for example, surface roughness, the two layers/patterns/structures have different distances from a reference plane, for example, a surface of a substrate, based on which a semiconductor device is formed.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

In the present disclosure, two layers/patterns/structures in a cell, a layout of a cell, or a layout of an integrated circuit being described to have a relation with each other, means that corresponding two layers/patterns/structures in a manufactured semiconductor integrated circuit based on the layout of the two layers/patterns/structures of the cell, the layout of the cell, or the layout of an integrated circuit have such a relation with each other. Here, the relation of the two layers/patterns/structures includes, but not limited to, the two layers/patterns/structures being electrically connected to each other, the two layers/patterns/structures being electrically isolated to each other, the two layers/patterns/structures having described relative positions, the two layers/patterns/structures having described relative dimensions, and the two layers/patterns/structures having described relative material constitutions.

In the present disclosure, not every layer of a cell or a layout is depicted in the drawings. One of ordinary skill in the art should understand that the cell or the layout can include more layers to implement functionality of the cell and omitting these layers is merely for convenience of descriptions.

Figure 2:
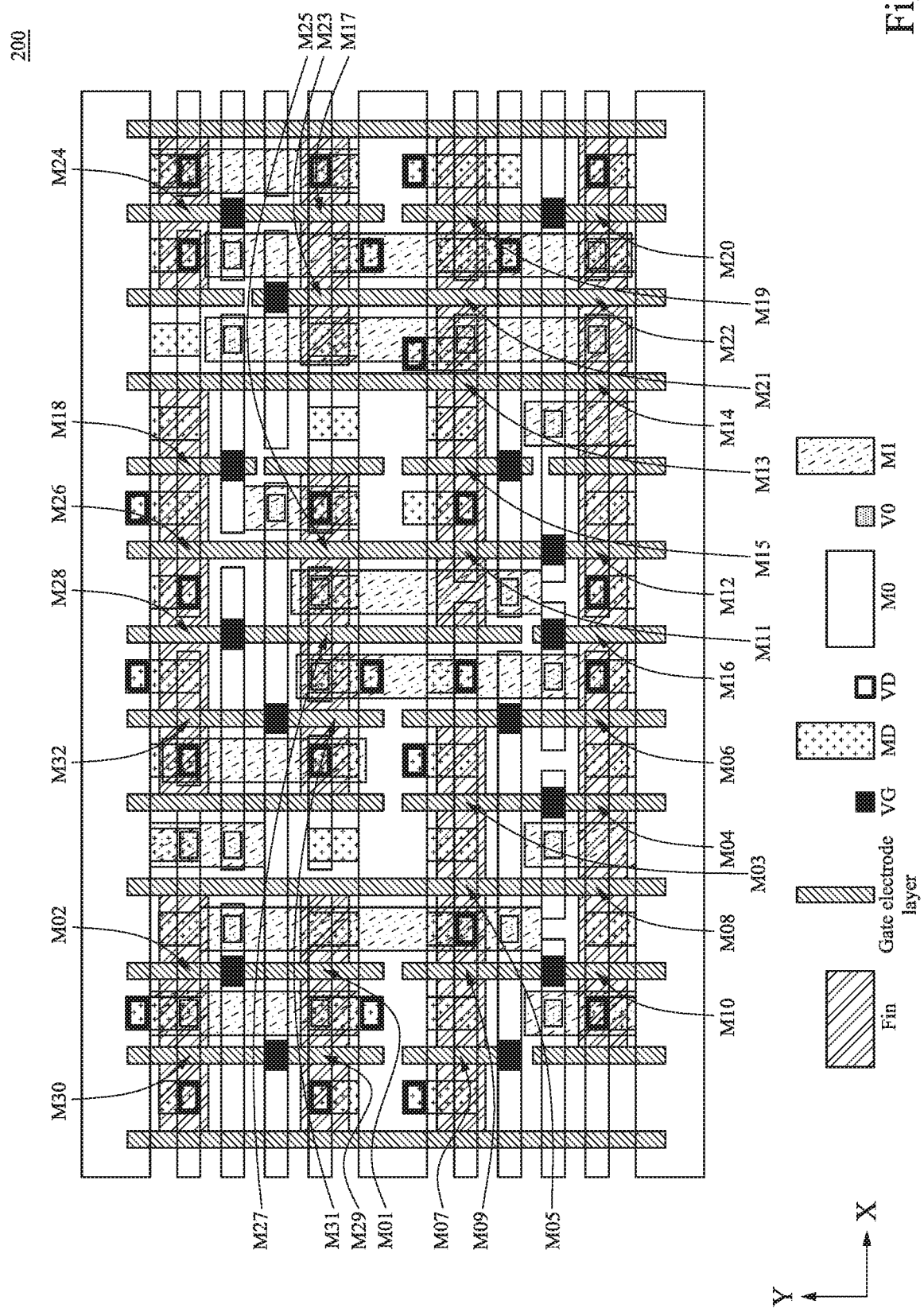
FIGS. 2 and 3 show a standard cell layout of the flip-flop circuit shown in FIG. 1, according to some embodiments of the present disclosure.
Figure 3:
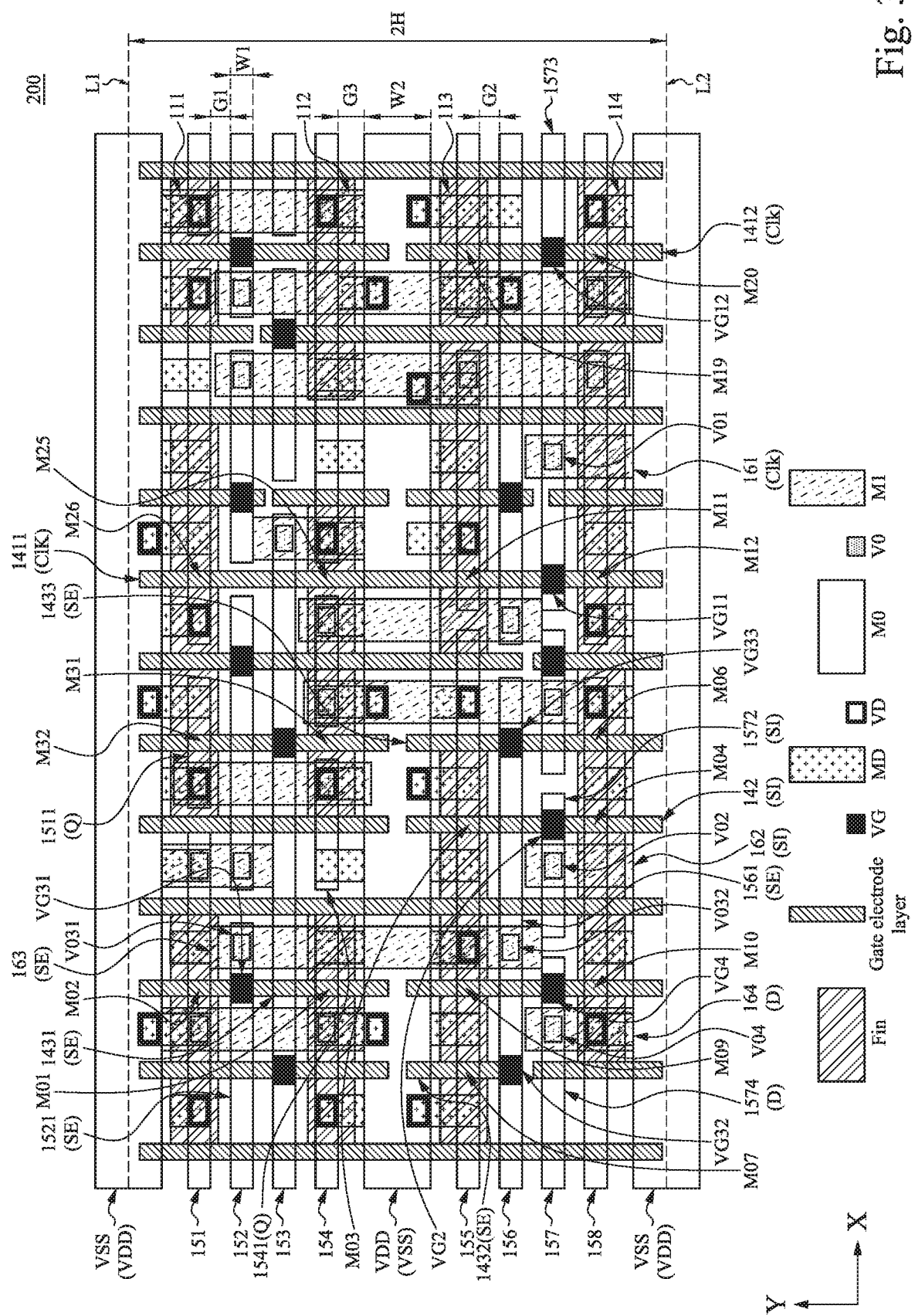
Figure 4:
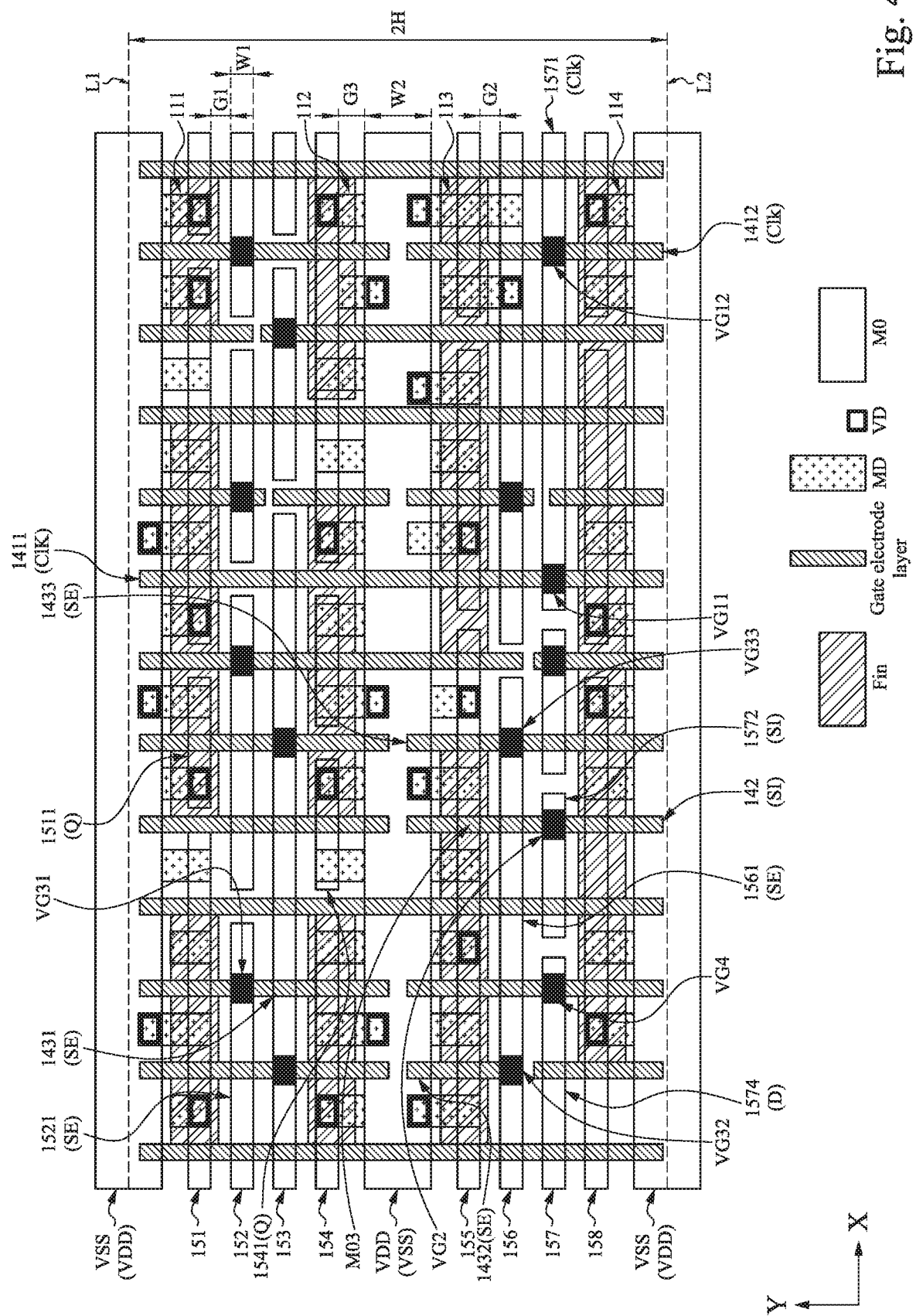
FIG. 4 shows a portion of the standard cell layout shown in FIG. 2 or FIG. 3.
Figure 5:
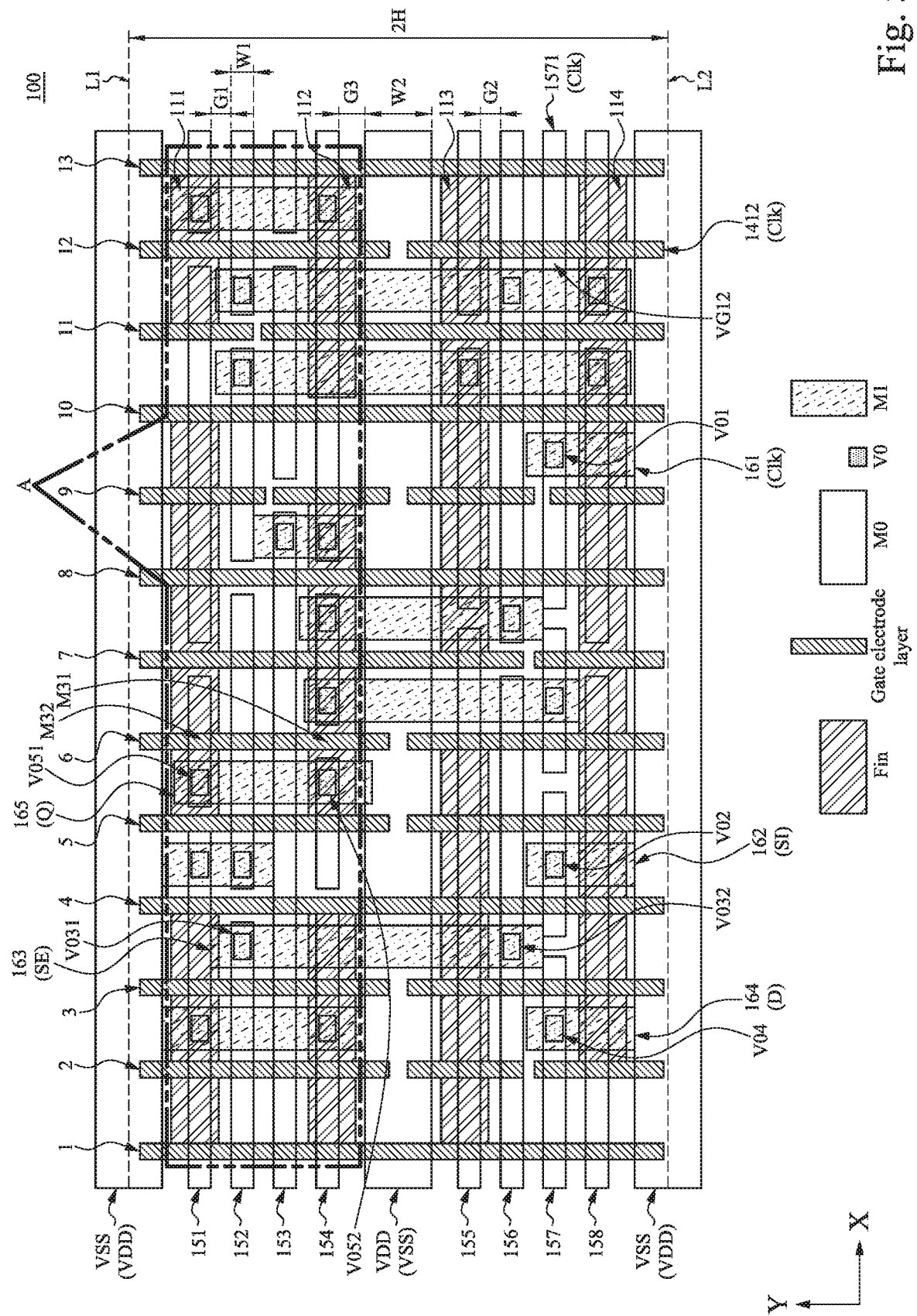
FIG. 5 shows a portion of the standard cell layout shown in FIG. 2 or FIG. 3.

FIG. 1 shows a circuit diagram of a flip-flop circuit, a standard cell layout of which is shown in FIGS. 2 and 3, according to some embodiments of the present disclosure. FIG. 4 shows a portion of the standard cell layout shown in FIG. 2 or FIG. 3. FIG. 5 shows a portion of the standard cell layout shown in FIG. 2 or FIG. 3.

For convenience of illustration, in FIGS. 2 and 3, elements of a standard cell layout 200 of a flip-flop circuit 100 shown in FIG. 1 are labeled separately, although the layouts shown in FIGS. 2 and 3 are the same as each other.

Each of FIGS. 2 and 3 shows various layers including a semiconductor fin layer (denoted by "Fin" in the drawings), a gate electrode layer (donated by "Gate electrode layer" in the drawings), a gate contact layer (denoted by "VG" in the drawings) for electrically connecting the gate electrode layer to an upper level layer such as a local connection layer M0 (denoted by "M0" in the drawings), a fin connection layer (denoted by "MD" in the drawings) for electrically connecting source/drain regions of the semiconductor fins, a contact layer (denoted by "VD" in the drawings) for electrically connecting the fin connection layer MD to the local connection layer M0, the local connection layer M0, a first via layer (denoted by "V0" in the drawings) for electrically connecting the local connection layer M0 to a first electrically conductive layer M1 (denoted by "M1" in the drawings), and the first electrically conductive layer M1, in some embodiments. In some embodiments, each of the local connection layer M0 and the electrically conductive layer M1 is a metal layer.

For convenience of explanation, FIGS. 4 and 5 each include a portion of the various layers shown in FIGS. 2 and 3 and some layers in FIGS. 2 and 3 are omitted. For example, FIG. 4 shows a layout including the semiconductor fin layer, the gate electrode layer, the gate contact layer VG, the fin connection layer MD, the contact layer VD, and the local connection layer M0. FIG. 5 shows a layout including the semiconductor fin layer, the gate electrode layer, the local connection layer M0, the first via layer V0, and the first electrically conductive layer M1.

Referring to FIG. 1, the flip-flop circuit 100 includes a plurality of transistors M01 through M32. The flip-flop circuit 100 is configured to receive input signals such as a scan input signal SI, a scan enable signal SE, a data input signal D, and a clock signal Clk, and output a data output signal Q. In some embodiments, the flip-flop circuit 100 is configured to store the received data signal D and output the stored data in the form of the output data signal D, in response to the scan input signal SI, the scan enable signal SE, and the clock signal Clk. In some embodiments, the scan input signal SI and/or the scan enable signal SE can be omitted.

In some embodiments, the clock signal Clk is the only clock signal received by the flip-flop circuit 100 from another cell or circuit. That is, no clock signal ClkB, which is a complemental clock signal of the clock signal Clk, is received by the flip-flop circuit 100 from another cell or circuit.

In some embodiments, an input signal, such as the scan input signal SI, the scan enable signal SE, the data input signal D, or the clock signal Clk, received by the flip-flop circuit 100 refers to a signal transmitted to a wiring or a contact of the flip-flop circuit 100 but before passing through a semiconductor device, such as a transistor, of the flip-flop circuit 100.

One of ordinary skill in the art should understand that connection points represented by the same element such as "seb" or "sl_a" in FIG. 1 are electrically connected to each other by wirings (not shown). Illustration of such elements in FIG. 1 is merely for convenience of illustration. The element such as "seb" or "sl_a" can be omitted if wirings are added to connect all the connection points represented by the same element in FIG. 1.

Referring to FIGS. 1-5, the standard cell layout 200 of the flip-flop circuit 100 according to some embodiments of the present disclosure includes transistors M01 to M32 made of first to fourth semiconductor fins 111-114 extending substantially parallel to X direction and gate electrode layers 2-12 extending substantially parallel to Y axis.

The standard cell layout 200 also includes the wirings and contacts/vias formed of the layers including, but not limited to, those represented by "VG", "MD", "VD", "M0", "V0", and "M1" in the drawings to implement local connections so as to route signals inside the standard cell layout 200 (or flip-flop circuit 100) and/or to implement global connections for receiving the input signals such as the scan input signal SI, the scan enable signal SE, the data input signal D, and the clock signal Clk from another circuit/cell, and for outputting the data output signal Q to another circuit/cell.

Although one reference numeral (i.e., one of 111-114) is used to represent all the semiconductor fin sections spaced apart from each other but aligned to each other in X axis, a semiconductor fin (i.e., one of semiconductor fins 111-114) refers to all the semiconductor fin sections located in the standard cell layout 200 and aligned with each other in X axis, according to some embodiments.

In some embodiments, the first to the fourth semiconductor fins 111-114 are sequentially arranged along −Y axis. The first and fourth semiconductor fins 111 and 114 disposed on edge regions of the standard cell layout 200 are configured to form first-type transistors, and the second and third semiconductor fins 112 and 113 disposed on an intermediate region between the edge regions of the standard cell layout 200 are configured to form second-type transistors.

In some embodiments, the first-type transistors are N-type transistors and the second-type transistors are P-type transistors, in a case in which electrically conductive wirings VSS used to transmit reference voltage potential such as ground are disposed on opposite edges of standard cell layout 200 in Y axis and an electrically conductive wiring VDD used to transmit voltage potential different from VSS is disposed on the intermediate region of the standard cell layout 200, as shown in the drawings. In this case, the first and fourth semiconductor fins 111 and 114 are formed in one or more first-type wells, for example, P-type wells (not shown), and thus, transistors formed based on the first and fourth semiconductor fins 111 and 114 are N-type transistors. The second and third semiconductor fins 112 and 113 are formed in one or more second-type wells, for example, N-type wells (not shown), and as such, the transistors formed based on the second and third semiconductor fins 112 and 113 are P-type transistors.

For example, referring to FIGS. 2-5, the first semiconductor fin 111 is configured to form N-type transistors including transistors M30, M02, M32, M28, M26, M18, and M24 disposed sequentially along X axis, the second semiconductor fin 112 is configured to form P-type transistors including transistors M29, M01, M31, M27, M25, M17, and M23 disposed sequentially along X axis, the third semiconductor fin 113 is configured to form P-type transistors including transistors M07, M09, M05, M03, M11, M15, M13, M21, and M19 disposed sequentially along X axis, and the fourth semiconductor fin 114 is configured to form N-type transistors including transistors M10, M08, M04, M06, M16, M12, M14, M22, and M20 disposed sequentially along X axis. An exemplary transistor such as a fin field-effect transistor (FinFET) to implement the transistors M01 to M32 of the flip-flop circuit 100 will be described later with reference to FIG. 8.

The present disclosure, however, is not limited to the above configuration. In other embodiments, the first-type transistors are P-type transistors and the second-type transistors are N-type transistors. In such a case, an electrically conductive wiring VSS used to transmit reference voltage potential such as ground is disposed on the intermediate region of the standard cell layout 200 and electrically conductive wirings VDD used to transmit voltage potential are disposed on opposite edge regions of the standard cell layout 200 in Y axis. In this case, the first and fourth semiconductor fins 111 and 114 are formed in one or more N-type wells (not shown), and as such, transistors formed based on the first and fourth semiconductor fins 111 and 114 are P-type transistors. The second and third semiconductor fins 112 and 113 are formed in one or more second-type wells, for example, P-type wells (not shown), and thus, the transistors formed based on the second and third semiconductor fins 112 and 113 are N-type transistors. One of ordinary skill in the art should understand that a standard cell layout according to such a configuration is different from that shown in FIG. 2 or FIG. 3. A description to modify the standard cell layout 200 will be omitted, since one of ordinary skill in the art should understand how to modify locations of the transistors M01 to M32 and wirings/contacts thereof to configure a standard cell layout in which the electrically conductive wiring VSS used to transmit ground is disposed on the intermediate region of the standard cell layout and the electrically conductive wirings VDD used to transmit voltage potential are disposed on edge regions of the standard cell layout in Y axis.

FIGS. 2-5 show two semiconductor fins 111 and 114 for forming the first-type transistors and two semiconductor fins 112 and 113 for forming the second-type transistors, but the present disclosure is not limited thereto. Although not shown in the drawings, in some embodiments, the standard cell layout 200 of the flip-flop circuit 100 can have three semiconductor fins for forming the first-type transistors and three semiconductor fins for forming the second-type transistors; in some embodiments, the standard cell layout 200 of the flip-flop circuit 100 can have three semiconductor fins for forming the first-type transistors and two semiconductor fins for forming the second-type transistors; and in some embodiments, the standard cell 200 of the flip-flop circuit 100 can have two semiconductor fins for forming the first-type transistors and three semiconductor fins for forming the second-type transistors. In some embodiments, the number of semiconductor fins can be determined based on required current driving capacities of the transistors. In some embodiments, the number of semiconductor fins forming the first-type transistors can be greater than three and the number of semiconductor fins forming the second-type transistors can be greater than three. In some embodiments, the number of semiconductor fins forming the first-type transistors can be the same as or different from the number of semiconductor fins forming the second-type transistors.

In the drawings, although one reference numeral (i.e., one of 2-12) is used to represent all the gate electrode sections aligned to each other in Y axis perpendicular to X axis, a gate electrode layer (i.e., one of gate electrode layers 2-12) refers to all the gate electrode sections located aligned with each other in Y axis.

In some embodiments, the gate electrode layer 2 is configured to form gate electrodes of transistors M07, M29, and M30 of the flip-flop circuit 100 disposed sequentially along Y axis, the gate electrode layer 3 is configured to form gate electrodes of M10, M09, M01, and M02 of the flip-flop circuit 100 disposed sequentially along Y axis, the gate electrode layer 4 is configured to form gate electrodes of transistors M08 and M05 of the flip-flop circuit 100 disposed sequentially along Y axis, the gate electrode layer 5 is configured to form gate electrodes of transistors M04 and M03 of the flip-flop circuit 100 disposed sequentially along Y axis, the gate electrode layer 6 is configured to form gate electrodes of transistors M06, M31, and M32 of the flip-flop circuit 100 disposed sequentially along Y axis, the gate electrode layer 7 is configured to form gate electrodes of transistors M16, M27, and M28 of the flip-flop circuit 100 disposed sequentially along Y axis, the gate electrode layer 8 is configured to form gate electrodes of transistors M12, M11, M25, and M26 of the flip-flop circuit 100 disposed sequentially along Y axis, the gate electrode layer 9 is configured to form gate electrodes of transistors M15 and M18 of the flip-flop circuit 100 disposed sequentially along Y axis, the gate electrode layer 10 is configured to form gate electrodes of transistors M14 and M13 of the flip-flop circuit 100 disposed sequentially along Y axis, the gate electrode layer 11 is configured to form gate electrodes of transistors M22, M21, and M17 of the flip-flop circuit 100 disposed sequentially along Y axis, and the gate electrode layer 12 is configured to form gate electrodes of transistors M20, M19, M23, and M24 of the flip-flop circuit 100 disposed sequentially along Y axis.

In some embodiments, the standard cell layout 200 includes first and second dummy gate electrode layers 1 and 13 extending continuously along Y axis and disposed on opposite sides of the gate electrode layers 2-12. The dummy gate electrode layers 1 and 13 and the gate electrode layers 2-12 are formed on the same layer, i.e., the layer represented by "Gate electrode layer" in the drawings. One of ordinary skill in the art should understand that a dummy gate electrode layer, unlike the gate electrode layers 2-12, can be electrically floating and can be used to improve dimensional accuracy when forming the gate electrode layers. In some embodiments, each of the dummy gate electrode layers 1 and 13 continuously extends to cross all of the semiconductor fins 111-114 in the standard cell layout 200. In some embodiments, a length of the dummy gate electrode layers 1 and 13 is equal to or greater than the longest one of the gate electrode layers 2-12. Additional features directed to the first and second dummy gate electrode layers 1 and 13 can be referred to FIGS. 6 and 7 to be described later.

Although FIGS. 2-5 show that the standard cell layout 200 includes thirteen gate electrode layers including the gate electrode layers 2-12 and the first and second dummy gate electrode layers 1 and 13, the present disclosure is not limited thereto. In some embodiments, the standard cell layout 200 of the flip-flop circuit can have more, or fewer, gate electrode layers, dependent on design particulars. In some embodiments, the gate electrode layers 2-13, together with the dummy gate electrode layers 1 and 13, are arranged with a constant pitch along X axis. In some embodiments, the gate electrode layers 2-13 and the dummy gate electrode layers 1 and 13 each has the same width in X axis.

Referring to FIGS. 2-5, the standard cell layout 200 of the flip-flop circuit 100 according to some embodiments of the present disclosure also includes a plurality of electrically conductive wirings, denoted by reference numerals 151-158, each extending substantially parallel to X axis. The plurality of electrically conductive wirings 151-158 can be formed of the same material on the same level, and include first electrically conductive wirings 151-154 disposed over an upper region between the upper electrically conductive wiring VSS and the electrically conductive wiring VDD, and second electrically conductive wirings 155-158 disposed over a lower region between the electrically conductive wiring VDD and the lower electrically conductive wiring VSS. In some embodiments, the electrically conductive wirings VDD, VSS, and 151-158 can be formed of the same electrically conductive layer, for example, the local connection layer M0.

Although one reference numeral (i.e., one of 151-158) is used to represent all the electrically conductive sections aligned to each other in X axis, an electrically conductive wiring (i.e., one of 151-158) refers to all the electrically conductive sections located in the standard cell layout 200 and aligned with each other in X axis.

In some embodiments, two or more sections, of the same metal wiring, spaced apart from each other can be used as a free wiring which may not be designated to transmit any clock signal and which, however, can be used to implement local interconnections among transistors or other electrically conductive wirings of the flip-flop circuit 100. Two or more discrete sections aligned to each other along X axis can be electrically connected to various transistors, vias, or other electrically conductive wirings on a level different from the aforementioned plurality of electrically conductive wirings 151-158. In some embodiments, one of the electrically conductive layers 151-158 can be electrically isolated from the other of the electrically conductive wirings 151-158.

Although each of the electrically conductive wirings 151-158 includes two or more sections spaced apart from each other, the present disclosure is not limited thereto. One of ordinary skill in the art should understand that one or more of the electrically conductive wirings 151-158 can be a single integral pattern extending substantially parallel to X axis. For example, an electrically conductive wiring can include a continuous pattern extending across the entire cell layout 100, and such an electrically conductive wiring can be used to connect adjacent cells in an integrated circuit.

The local connection layer M0 including the electrically conductive wirings 151-158 and the electrically conductive wirings VDD and VSS can be electrically connected to the first to fourth semiconductor fins 111-114, the gate electrode layers 2-12, and/or other electrically conductive wirings made of the first electrically conductive layer M1 on a level above the local connection layer M0, through vias/contacts (denoted by "VD" and "MD" in the drawings).

In some embodiments, some of the electrically conductive wirings 151-158 are free to be allocated to any signals including, but not limited to, input signals such as the scan input signal SI, and the scan enable signal SE, the data input signal D, and the clock signal Clk, and the data output signal Q.

Although the drawings show that the standard cell layout 200 includes eight electrically conductive wirings 151-158 extending substantially parallel to X axis, the present disclosure is not limited thereto. In some embodiments, the dual-height standard cell 100 can have fewer electrically conductive wirings, or have more electrically conductive wirings for local or global electrical connections, dependent on design particulars. In some embodiments, the number of electrically conductive wirings is six, three of which are disposed between the upper electrically conductive wiring VSS and the electrically conductive wiring VDD and another three of which are disposed between the lower electrically conductive wiring VSS and the electrically conductive wiring VDD.

In some embodiments, a gap in Y axis between the immediately adjacent electrically conductive wirings VDD and 154 (VSS and 151, 155 and VDD, or 158 and VSS) can be a constant, and a width in Y axis of the electrically conductive wirings 151-158 can be another constant. In some embodiments, a gap G1 in Y axis between any immediately adjacent electrically conductive wirings among the electrically conductive wirings 151-154 can be the same as each other, and a gap G2 in Y axis between any immediately adjacent electrically conductive wirings among the electrically conductive wirings 155-158 can be the same as each other. In some embodiments, G1 is substantially the same as G2. In some embodiments, the gap G1 or the gap G2 is equal to or less than a gap G3 in Y axis between the immediately adjacent electrically conductive wirings VDD and 154 (VSS and 151, 155 and VDD, or 158 and VSS). In some embodiments, a width W1 in Y axis of the electrically conductive wirings 151-158 can be the same as each other. In some embodiments, a width W2 in Y axis of the electrically conductive wirings VSS and VDD is twice the width W1 in Y axis of the electrically conductive wirings 151-158. In this regard, the height 2H of the standard cell layout 200 is a function of the gaps G1, G2, and G3, the width W1, the number of the electrically conductive wirings 151-158, and the width of electrically conductive wirings VSS and VDD. The present disclosure, however, is not limited thereto.

In some embodiments, the height 2H of the standard cell layout 200 is a distance between a central line L1 equally dividing the upper electrically conductive wiring VSS in Y axis and a central line L2 equally dividing the lower electrically conductive wiring VSS in Y axis, as shown in FIG. 1.

In some embodiments, the height 2H can be defined twice the pitch of two immediately adjacent electrically conductive wirings VSS and VDD for transmit different voltage potential, or the height 2H can be defined the pitch of the electrically conductive wirings VSS for transmit the same voltage potential.

In some embodiments, the standard cell layout 200 further includes the first electrically conductive layer M1 based on which electrically conductive wirings for receiving the input signals such as the scan input signal SI, the scan enable signal SE, the data input signal D, and the clock signal Clk from another cell/circuit and for outputting the data output signal Q to another cell/circuit. As shown in the drawings, the electrically conductive wirings in the first electrically conductive layer M1 extend substantially parallel to Y axis and disposed between adjacent patterns of the gate electrode layer.

Referring to the drawings, a wiring 161 (shown in FIG. 5) of the first electrically conductive layer M1 receives the input clock signal Clk from another cell or circuit through another electrically conductive wiring made of, for example, a second metal layer (not shown). The received clock signal Clk is transmitted from the wiring 161 to an electrically conductive section 1571 (shown in FIGS. 3 and 4) of the electrically conductive wiring 157 (shown in FIGS. 3-5) made of the local connection layer M0 through a via V01 (shown in FIG. 5) therebetween. The electrically conductive section 1571 transmits the clock signal Clk to a gate electrode section 1411 (shown in FIGS. 3 and 4) corresponding to the entire gate electrode layer 8 (shown in FIG. 5) through a via VG11 (shown in FIG. 4) therebetween. The electrically conductive section 1571 also transmits the clock signal Clk to a gate electrode section 1412 (shown in FIGS. 3 and 4) corresponding to a portion of the gate electrode layer 12 (shown in FIG. 5) through a via VG12 (shown in FIG. 4) therebetween. Accordingly, the clock signal Clk is transmitted to the gate electrodes of transistors M12, M11, M25, and M26 (shown in FIG. 3) through the gate electrode section 1411, and the clock signal Clk is also transmitted to the gate electrodes of transistors M19 and M20 (shown in FIG. 3) through the gate electrode section 1412.

In some embodiments, the gate electrode layer used to transmit the clock signal Clk can include one gate electrode layer such as the gate electrode layer 8 which continuously extends across the first to fourth semiconductor fins 111-114 and no cut process such as a poly cut process is performed to such a gate electrode layer. As such, the same continuous gate electrode layer 8 is used to transmit the clock signal Clk to both N-type transistors such as transistors M12 and M26 and P-type transistors such as transistors M 11 and M25.

Referring to the drawings, in the standard cell layout 200, in the local connection layer M0, the electrically conductive wiring 157 is the only electrically conductive wiring used to transmit the clock signal Clk. Thus, the remaining wirings 151-156 and 158 can be used to route other types of signals other than the clock signal. Further, the electrically conductive wiring 157 includes the electrically conductive section 1571 configured to route the clock signal Clk and other electrically conductive sections including, but not limited to, electrically conductive wirings 1572 and 1574 configured to route the scan input signal SI and the data input signal D, respectively.

In some embodiments, the standard cell layout 200 of the flip-flop circuit 100 receives only one clock signal Clk which is redistributed to various transistors in the flip-flop circuit 100 through local wirings and/or contacts/vias. In some embodiments, the standard cell layout 200 of the flip-flop circuit 100 does not receive another clock signal ClkB which is complementary to the clock signal Clk.

In some embodiments, in the local connection layer M0, only one wiring or only one section of all the wirings transmits the clock signal ClkB, as described above. In some embodiments, the flip-flop circuit 100 does not include any CMOS transmission gate, which uses both the clock signal Clk and the complementary clock signal ClkB. A transmission gate is a CMOS based switch in which a PMOS passes a strong 1 but poor 0 and an NMOS passes strong 0 but poor 1. Both PMOS and NMOS work simultaneously such that the transmission gate can conduct in both directions by a control signal including a clock signal and a complemental clock signal.

Accordingly, the standard cell layout 200 according to embodiments of the present disclosure has more design freedom, as more wirings or more sections of the wirings are available to wire other signals, as compared to a cell layout which uses the local connection layer to transmit both the clock signal Clk and the complementary clock ClkB.

Referring to the drawings, a wiring 162 (shown in FIG. 5) of the first electrically conductive layer M1 receives the input scanning signal SI from another cell or circuit through another electrically conductive wiring made of, for example, the second metal layer (not shown). The received scan input signal SI is transmitted from the wiring 162 to an electrically conductive section 1572 (shown in FIGS. 3 and 4) of the electrically conductive wiring 157 (shown in FIGS. 3-5) made of the local connection layer M0 through a via V02 (shown in FIG. 5) therebetween. The electrically conductive section 1572 transmits the scan input signal SI to a gate electrode section 142 (shown in FIGS. 3 and 4) corresponding to a portion of the gate electrode layer 5 (shown in FIG. 5) through a via VG2 (shown in FIG. 4) therebetween. Accordingly, the scan input signal SI is transmitted to the gate electrodes of transistors M03 and M04 (shown in FIG. 3) through the gate electrode section 142.

Referring to the drawings, a wiring 163 (shown in FIG. 5) of the first electrically conductive layer M1 receives the input scan enable signal SE from another cell or circuit through another electrically conductive wiring made of, for example, the second metal layer (not shown). The received scan enable signal SE is transmitted from the wiring 163 to an electrically conductive section 1521 (shown in FIGS. 3 and 4) of the electrically conductive wiring 152 (shown in FIGS. 3-5) made of the local connection layer M0 through a via V031 (shown in FIG. 5) therebetween. The received scan enable signal SE is also transmitted from the wiring 163 to an electrically conductive section 1561 (shown in FIGS. 3 and 4) of the electrically conductive wiring 156 (shown in FIGS. 3-5) made of the local connection layer M0 through a via V032 (shown in FIG. 5) therebetween. The electrically conductive section 1521 transmits the scan enable signal SE to a gate electrode section 1431 (shown in FIGS. 3 and 4) corresponding to a portion of the gate electrode layer 3 (shown in FIG. 5) through a via VG31 (shown in FIG. 4) therebetween. Accordingly, the scan enable signal SE is transmitted to the gate electrodes of transistors M01 and M02 (shown in FIG. 3) through the gate electrode section 1431. The electrically conductive section 1561 transmits the scan enable signal SE to a gate electrode section 1432 (shown in FIGS. 3 and 4) corresponding to a portion of the gate electrode layer 2 (shown in FIG. 5) through a via VG32 (shown in FIG. 4) therebetween and to a gate electrode section 1433 (shown in FIGS. 3 and 4) corresponding to a portion of the gate electrode layer 2 (shown in FIG. 5) through a via VG33 (shown in FIG. 4) therebetween. Accordingly, the scan enable signal SE is transmitted to the gate electrode of transistor M07 (shown in FIG. 3) through the gate electrode section 1433 and to the gate electrode of transistor M06 (shown in FIG. 3) through the gate electrode section 1433.

Referring to the drawings, a wiring 164 (shown in FIG. 5) of the first electrically conductive layer M1 receives the data input signal D from another cell or circuit through another electrically conductive wiring made of, for example, the second metal layer (not shown). The received data input signal D is transmitted from the wiring 164 to a metal wiring section 1572 (shown in FIGS. 3 and 4) of the electrically conductive wiring 157 (shown in FIGS. 3-5) made of the local connection layer M0 through a via V04 (shown in FIG. 5) therebetween. The electrically conductive section 1572 transmits the data input signal D to a gate electrode section 144 (shown in FIGS. 3 and 4) corresponding to a portion of the gate electrode layer 3 (shown in FIG. 5) through a via VG4 (shown in FIG. 4) therebetween. Accordingly, the data input signal D is transmitted to the gate electrodes of transistors M09 and M10 (shown in FIG. 3) through the gate electrode section 142.

Referring to the drawings, a wiring 165 (shown in FIG. 5) of the first electrically conductive layer M1 outputs the data output signal Q to another cell or circuit through another electrically conductive wiring made of, for example, the second metal layer (not shown). The output data output signal Q is transmitted from an electrically conductive section 1511 (shown in FIGS. 3 and 4) of the electrically conductive wiring 151 (shown in FIGS. 3-5) made of the local connection layer M0 through a via V051 (shown in FIG. 5) therebetween and from an electrically conductive section 1541 (shown in FIGS. 3 and 4) of the electrically conductive wiring 154 (shown in FIGS. 3-5) made of the local connection layer M0 through a via V052 (shown in FIG. 5) therebetween. The electrically conductive sections 1511 and 1541 receives the output data signals from drains of the transistors M31 and M32 through vias made of VD and MD therebetween.

One of ordinary skill in the art should understand that the above layout configured to receive the input signals, to transmit the output signal, and to locally route signals is merely an example. According to other embodiments, the layout to implement the flip-flop circuit 100 can be different from that shown in FIGS. 2-5, dependent on design particulars. For example, one or more of transistors M01 to M32 can be repositioned, the number of the wirings (or the wiring sections) can be increased or decreased, and the number of semiconductor fins (or the semiconductor fin sections) can be increased or decreased, the number of the gate electrode layers (or the gate electrode sections) can be increased or decreased. One of ordinary skill in the art should also understand that the location and/or number of contacts or vias for vertically connect different layers can also be changed.

Figure 6:
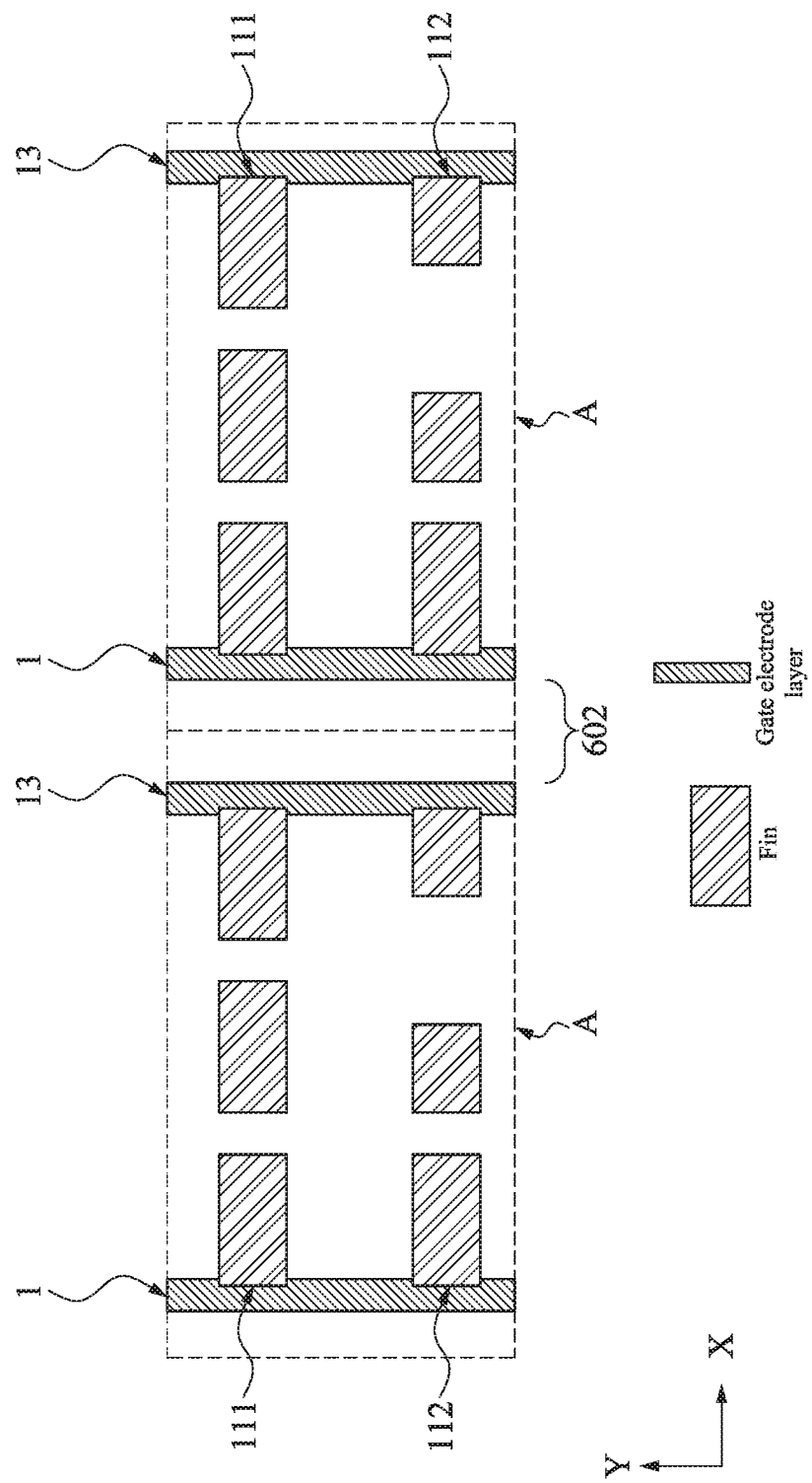
FIG. 6 shows a portion A of the layout shown in FIG. 5.

FIG. 6 shows a portion of an integrated circuit including a portion A of the layout shown in FIG. 5. For convenience, only the layers including the semiconductor fins (denoted by "Fin" in the drawings) and the gate electrode layers (denoted by "Gate electrode layer" in the drawings) are illustrated in FIG. 6. In addition, the gate electrode layers 2-12 shown in FIG. 5 are omitted in FIG. 6 for convenience of illustration. To show relative lateral (or horizontal) positions of the semiconductor fins and the gate electrode layers, the semiconductor fins shown in FIG. 6 are imposed on top of the gate electrode layers. One of ordinary skill in the art should understand that during manufacturing, the gate electrode layers are formed above the semiconductor layers instead.

Referring to FIG. 6, the portion A shown in FIG. 5 is duplicated and thus two portions A are placed immediately adjacent to each other in X axis. In FIG. 6, the first and second dummy gate electrode layers 1 and 13 are disposed on opposite edges of the portion A in X axis. The second dummy gate electrode layer 13 of the left portion A and the first dummy gate electrode layer 1 of the right portion A, which are two immediately adjacent patterns in the gate electrode layer, are spaced-apart from each other in X axis.

A structure, denoted by reference numeral 602 representing edge portions of the two portions A, is a double diffusion break (DDB), which is filled with an isolation material on a level of the semiconductor fin level and has a width in X axis approximately equal to a pitch in X axis of the gate electrode layers.

One of ordinary skill in the art should understand that using two identical cells in FIG. 6 is only for convenience of explanation; the present disclosure, however, is not limited to. In other embodiments, two different cells immediately adjacent to each other can have a boundary configured to the same as that shown in FIG. 6.

Figure 7:
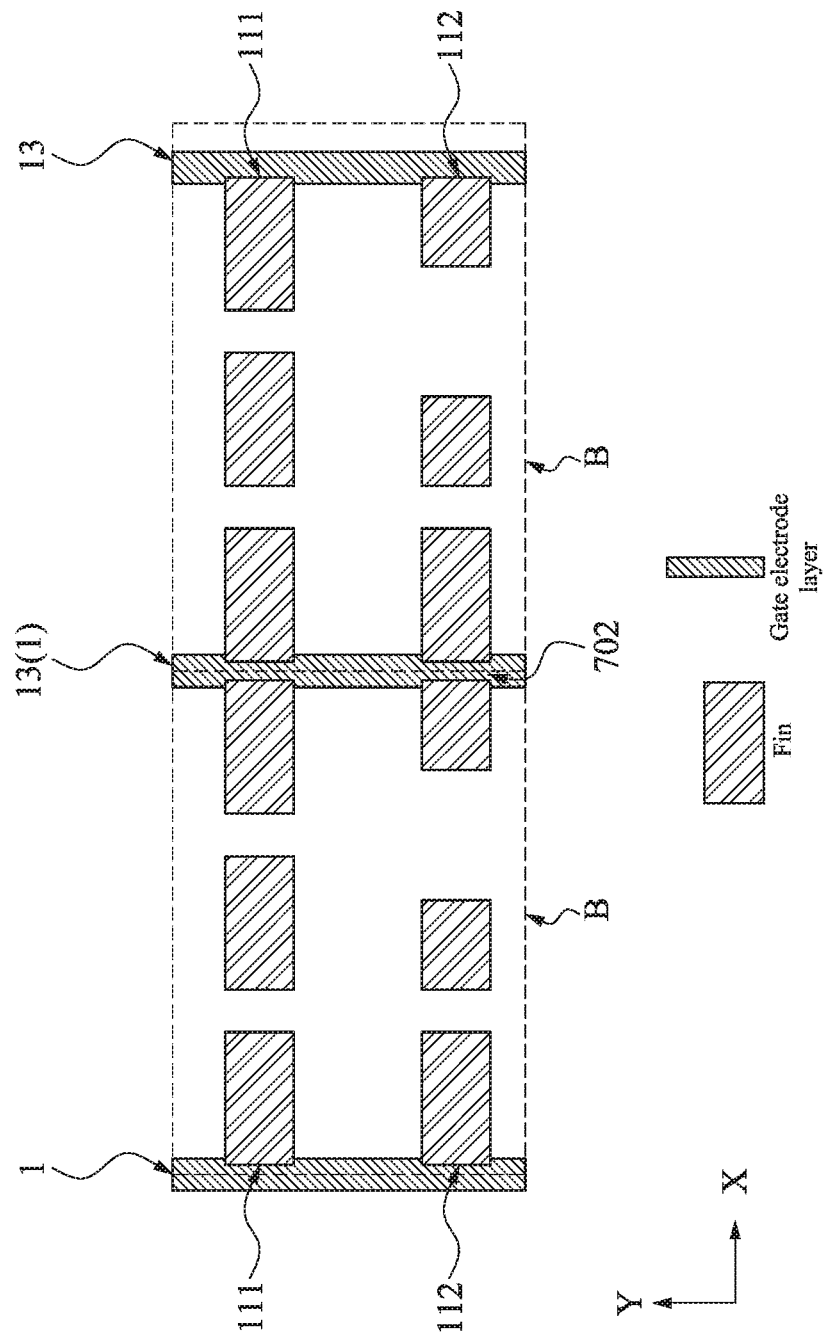
FIG. 7 shows a portion of an integrated circuit including a modified example based on a configuration shown in FIG. 6.

FIG. 7 shows a modified example based on the configuration shown in FIG. 6. Each portion B shown in FIG. 7 is substantially the same as the portion A shown in FIG. 6, except that the second dummy gate electrode layer 13 of the left portion A in FIG. 6 and the first dummy gate electrode layer 1 of the right portion A in FIG. 6 overlapped with each other in FIG. 7. In this regard, each portion B (or each standard cell 200) owns a half of the commonly owned dummy gate electrode layer 2(1) of the two adjacent standard cell layouts.

Referring to FIG. 7, a structure, denoted by reference numeral 702 representing a common edge portion of the two portions B, is a single diffusion break (SDB), which is filled with an isolation material on a level of the semiconductor fin level and has a width in X axis less than a width of the dummy gate electrode layer 2 (or 1) in X axis.

One of ordinary skill in the art should understand that using two identical cells in FIG. 7 is only for convenience of explanation; the present disclosure, however, is not limited to. In other embodiments, two different cells immediately adjacent to each other can have a boundary configured to the same as that shown in FIG. 7.

Figure 8:
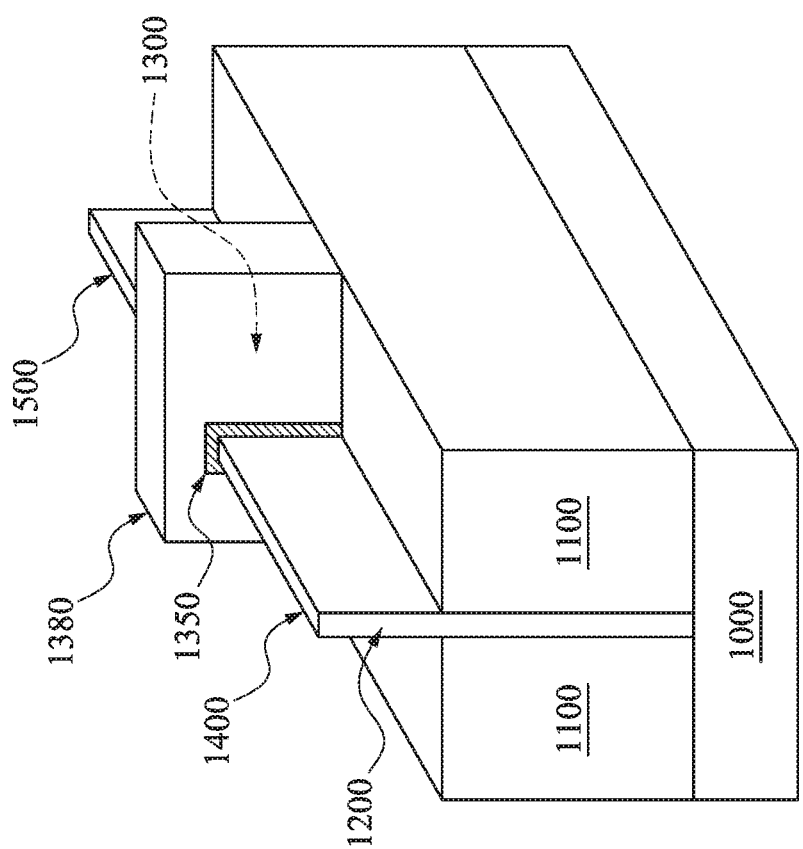
FIG. 8 is a perspective view of an exemplary fin field-effect transistor (FinFET), which can be employed to implement various transistors of a standard cell layout according to embodiments of the present disclosure.

FIG. 8 is a perspective view of an exemplary fin field-effect transistor (FinFET), which can be employed to implement various transistors of the standard cell layout 200 described above.

Referring to FIG. 8, a FinFET includes a semiconductor fin 1200 formed, for example, of silicon, protruding from a substrate 1000, for example, a silicon substrate. The semiconductor fin 1200 can be a trench-etched substrate or grown by epitaxy. Alternatively, the semiconductor fin 1200 can be made of a device layer of a silicon-on-insulator (SOI) substrate. A lower portion of the semiconductor fin 1200 is interposed between isolation regions 110 formed over the substrate 1000. The isolation regions 1100 are Shallow Trench Isolation (STI) regions as an example to be described next. The present disclosure, however, is not limited thereto. The isolation regions 1100 can be field oxide regions, according to another embodiment.

The FinFET further includes a source region 1400 and a drain region 1500 and a channel region 1300 interposed therebetween. The source region 140, the drain region 1500, and the channel region 1300 of the FinFET are made of a top portion of the semiconductor fin 1200 at a level above the isolation regions 110. The source and drain regions 1400 and 1500 are heavily doped, while the channel region 1300 is undoped or lightly doped.

A gate electrode 1380 is made of one or more layers of metal material, such as W, or Co, and may further include other work function adjusting metals, is formed over the channel region 1300, and extends to cover sidewalls of the channel region 1300 and to cover portions of the isolation regions 1100. The FinFET also has a gate insulating layer 1350 formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixture thereof. The gate insulating layer 1350 is interposed between the gate electrode 1380 and the channel region 1300 to electrically isolate them from each other.

It should be appreciated that metal contacts (made of, for example, the layer MD described above) can be formed over the source and drain regions 1400 and 1500, and/or a gate electrode layer contact (made of, for example, the layer VG described above) can be formed over the gate electrode 1380, to electrically connect the source and drain regions 1400 and 1500, and/or the gate electrode 1380 to various electrically conductive layers (for example, the local connection layer M0 and the first electrically conductive layer M1 describe above).

Figure 9:
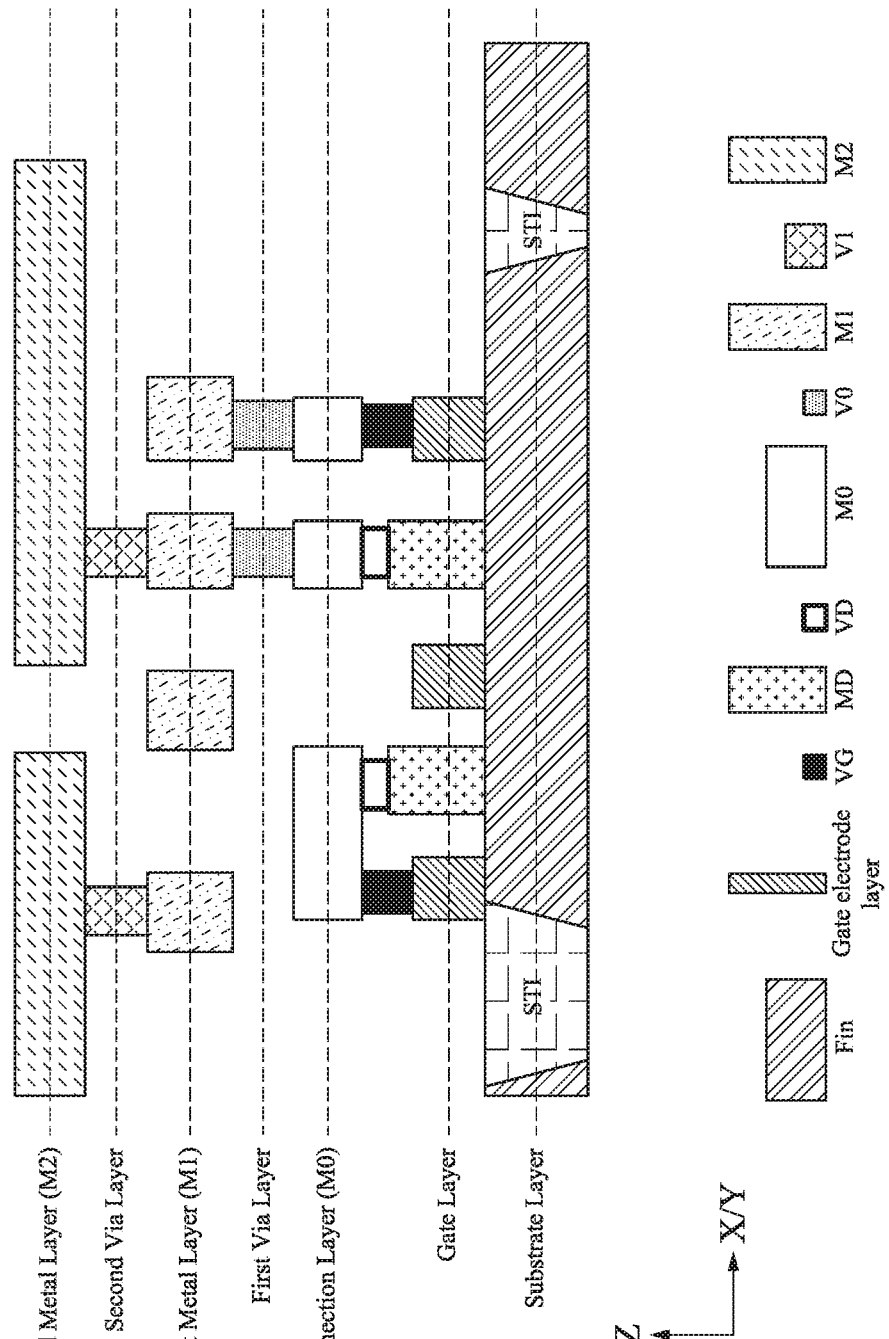
FIG. 9 shows a cross sectional view illustrating a vertical layer arrangement of a semiconductor device relating to embodiments of the present disclosure.

FIG. 9 shows a cross sectional view illustrating a vertical layer arrangement of a semiconductor device relating to the embodiments of the present disclosure. FIG. 9 does not necessarily show a specific cross section of the standard cell layout described with respect to FIGS. 2-5.

Referring to FIGS. 2-5 and 9, in the substrate layer, the semiconductor fins 111-114 are disposed. In the gate electrode layer, gate structures including gate electrode layers 2-12 and the first and second dummy gate electrode layers 1 and 13 and gate dielectric layers are disposed. The local connection layer M0 is located above the gate electrode layer and/or the semiconductor fins and connected to the semiconductor fins through contacts/via MD and VD and connected to the gate electrode layers through gate contacts VG. In the local connection layer, the electrically conductive wirings 151-158, VDD, and VSS are formed. The first via layer V0 is located between the local connection layer M0 and the first electrically conductive layer M1. In the first electrically conductive layer M1, the scan input signal SI, the scan enable signal SE, the data input signal D, the clock signal Clk, and the data output signal Q are received from another cell or circuit. In some embodiments, the vertical layer arrangement includes a second via layer V1, in which the second vias V1 are disposed, and a second electrically conductive layer M2 in which second electrically conductive wirings are disposed. The second electrically conductive wirings can be configured to transmit the first electrically conductive layer M1, the scan input signal SI, the scan enable signal SE, the data input signal D, and the clock signal Clk from another cell or circuit to the flip-flop circuit 100 and to transmit the data output signal Q from the flip-flop circuit 100 to another cell or circuit.

The first electrically conductive layer M1 and above are made of metal, such as Cu, Al, or an alloy thereof with one or more thin conductive layers (e.g., Ta, Ti, TiN and/or TaN), and the local interconnect wiring M0 is made of different material than the first electrically conductive layer M1 and above and includes Ni, Co, W, Mo, an alloy thereof with one or more thin conductive layers (e.g., Ta, Ti, TiN and/or TaN), in some embodiments.

Figure 10:
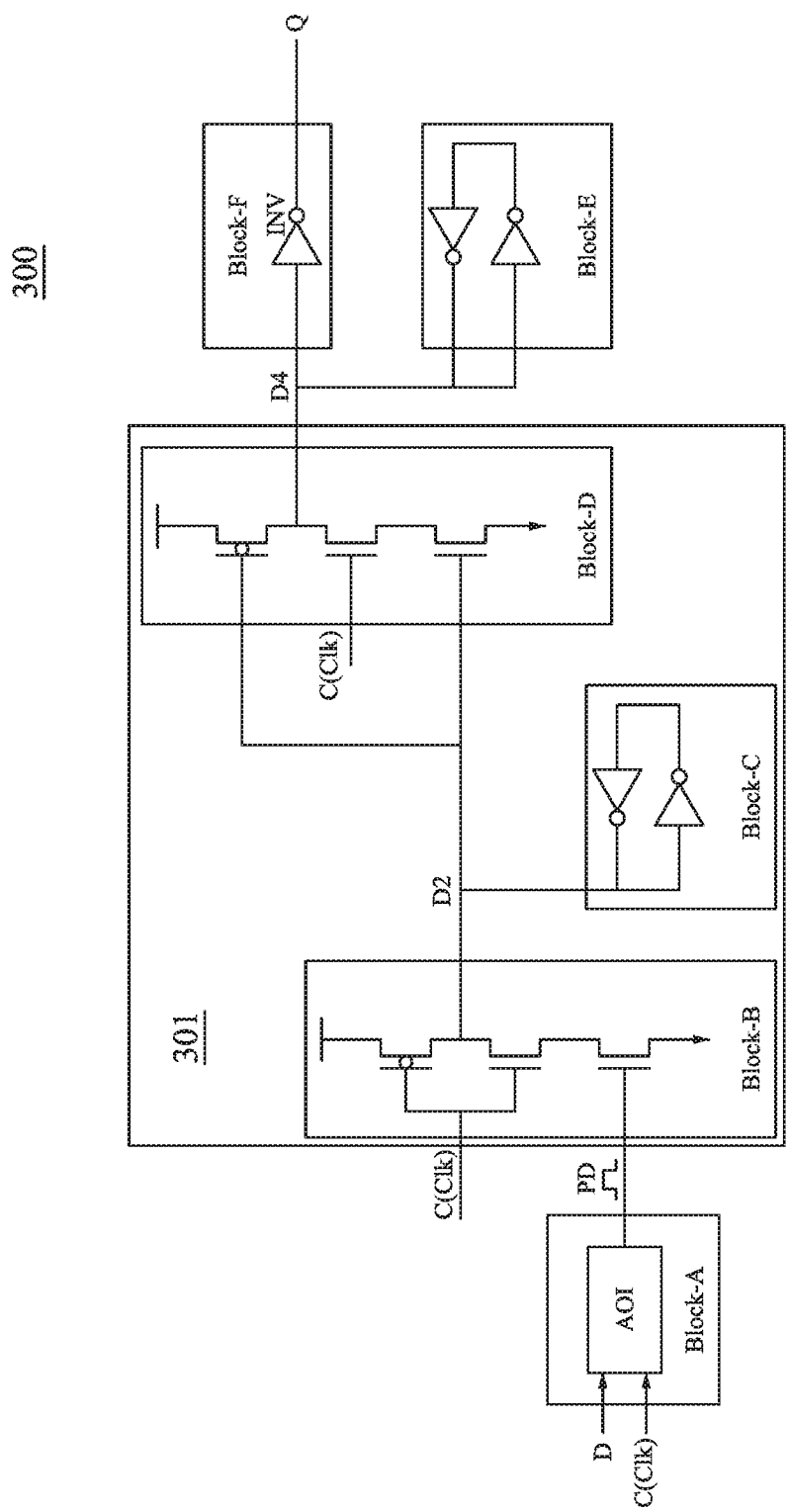
FIG. 10 shows a circuit block of a flip-flop circuit.
Figure 11:
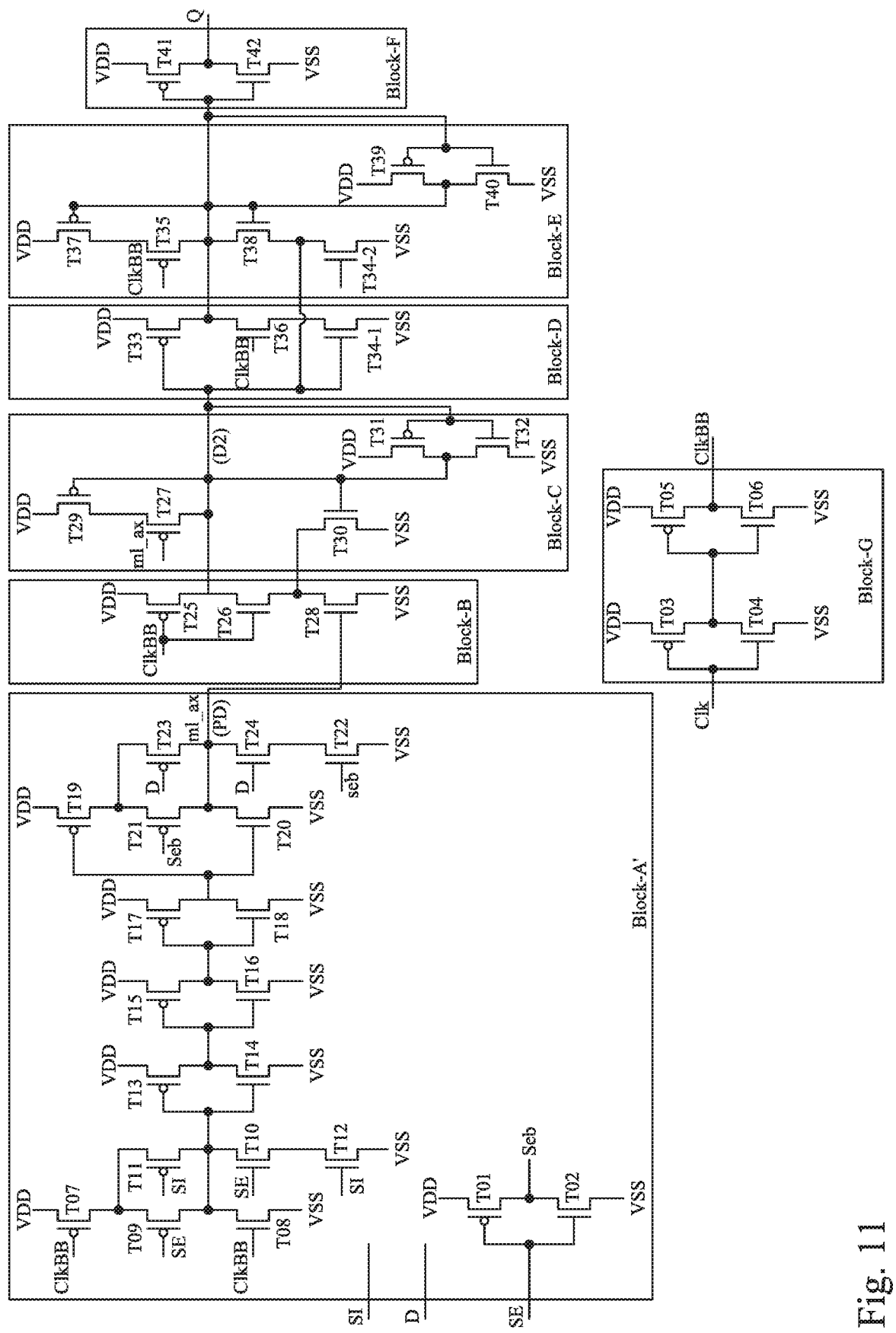
FIG. 11 shows a detailed circuit diagram corresponding to the circuit block shown in FIG. 10.

FIG. 10 shows a circuit block of another flip-flop circuit, a detailed circuit diagram of which is shown in FIG. 11.

Referring to FIG. 10, the flip-flop circuit 300 includes a data synchronizing block block-A including a clock input terminal C receiving a clock signal Clk, an input terminal D receiving data input signal, an AND-OR-Invert (AOI) logic converting the data input signal into a pulse signal PD synchronized by the clock signal Clk. The flip-flop circuit 300 further includes a latch circuit 301 including block-B, block-C, and block-D. In response to edges of the pulse signal PD and the clock signal Clk generated by block-B, the pulse signal PD indicative of the input data stream is stored at a storage node D2 of cross-coupled inventers provided by a storage block-C, and the stored signal at the storage node D2 is output to node D4 in response to edges of the stored signal and the clock signal Clk generated by block-D. The flip-flop circuit 300 further includes an output buffer block-E and an inverter block-F providing an output terminal Q outputting data signal by inverting the data transmitted to node D4.

As shown in FIG. 10, only one clock signal Clk is used and the flip-flop circuit 300 thus is a transmission gate free flip-flop, in which the AOI logic for converting the data input signal into the pulse signal PD is used to replace the function of the CMOS based transmission gate. In this case, the complementary clock signal ClkB is not used in the transmission gate free flip-flop circuit 300 shown in FIG. 10.

In some embodiments, the flip-flop circuit 300 shown in FIG. 10 does not have two types of clock signals Clk and ClkB. That is, fewer electrically conductive wirings among the electrically conductive wirings are used to transmit the clock signal, as compared to a comparative example in which a flip-flop circuit having a similar circuit diagram as the flip-flop circuit shown in FIG. 10 but utilizes two types of clock signals Clk and ClkB. As a result, the height of the standard cell layout of the flip-flop circuit shown in FIG. 10 can be reduced comparing to the comparative example, or if the height of the standard cell layout of the flip-flop circuit shown in FIG. 10 is maintained the same, the standard cell layout of the flip-flop circuit shown in FIG. 10 has more design freedom, as more electrically conductive wirings among the available electrically conductive wirings can be used to transmit signals other than the clock signal ClkB.

One of ordinary skill in the art should understand that using AOI logic is merely an example, and the present disclosure is not limited thereto. In other embodiments, OAI logic or a multiplexer other than AOI logic can be used to convert input data stream into a pulse signal synchronized by a clock signal.

FIG. 11 shows a circuit diagram of the circuit block shown in FIG. 10. One of ordinary skill in the art should understand that scan input signal and scan enable signal are omitted in the circuit block shown in FIG. 10 for convenience of explanation. The circuit block shown in FIG. 10, if implemented together with a scan input signal and a scan enable signal, can be realized by a plurality of transistors T01 through T42 in a flip-flop circuit 300' shown in FIG. 11. One of ordinary skill in the art should understand that block-A' shown in FIG. 11 is substantially the same as the block-A in FIG. 10, except that the scan input signal SI and the scan enable signal SE are included.

In some embodiments, the clock signal Clk (see, block-G) is the only clock signal received by the flip-flop circuit 300' from another cell or circuit. That is, no clock signal ClkB, which is a complemental clock signal of the clock signal Clk, is received by the flip-flop circuit 300' from another cell or circuit. In some embodiments, clock signal ClkBB which is complementary to signal ClkB which is complementary to clock signal Clk can be obtained by two serially coupled inverters in block-G for internal use.

In some embodiments, an input signal, such as the scan input signal SI, the scan enable signal SE, the data input signal D, or the clock signal Clk, received by the flip-flop circuit 300' refers to a signal transmitted to a wiring or a contact of the flip-flop circuit 300' but before passing through a semiconductor device, such as a transistor, of the flip-flop circuit 300'.

One of ordinary skill in the art should understand that connection points represented by the same element such as "seb," "sl_ax," "ClkB," and "ClkBB" in FIG. 11 are electrically connected to each other by wirings (not shown). Illustration of such elements in FIG. 11 is merely for convenience of explanation. The element such as "seb," "sl_ax," "ClkB," and "ClkBB" can be omitted if wirings are used to connect all the connection points represented by the same element in FIG. 11.

Figure 12:
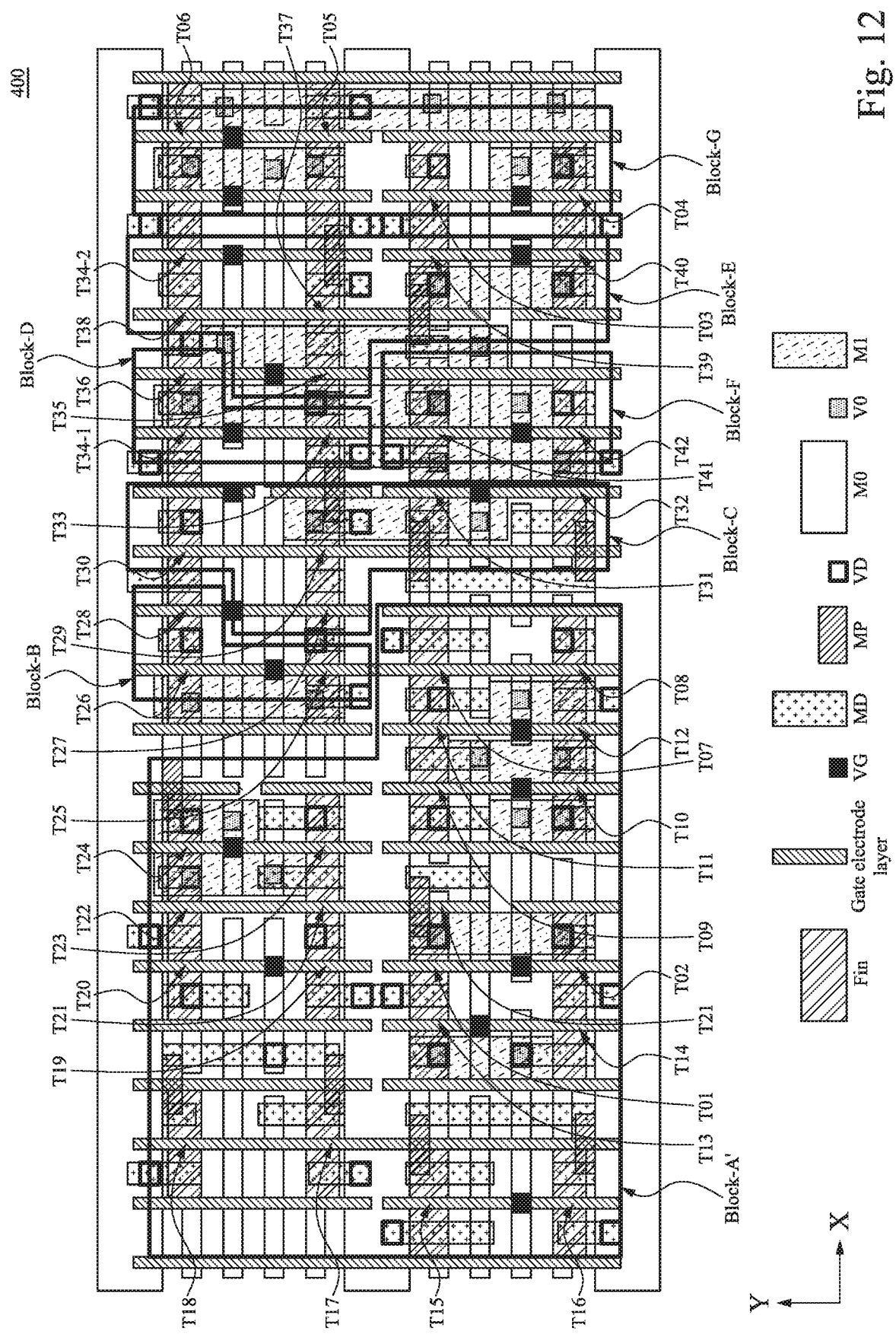
FIGS. 12 and 13 show a standard cell layout of the flip-flop circuit shown in FIG. 11, according to some embodiments of the present disclosure.
Figure 13:
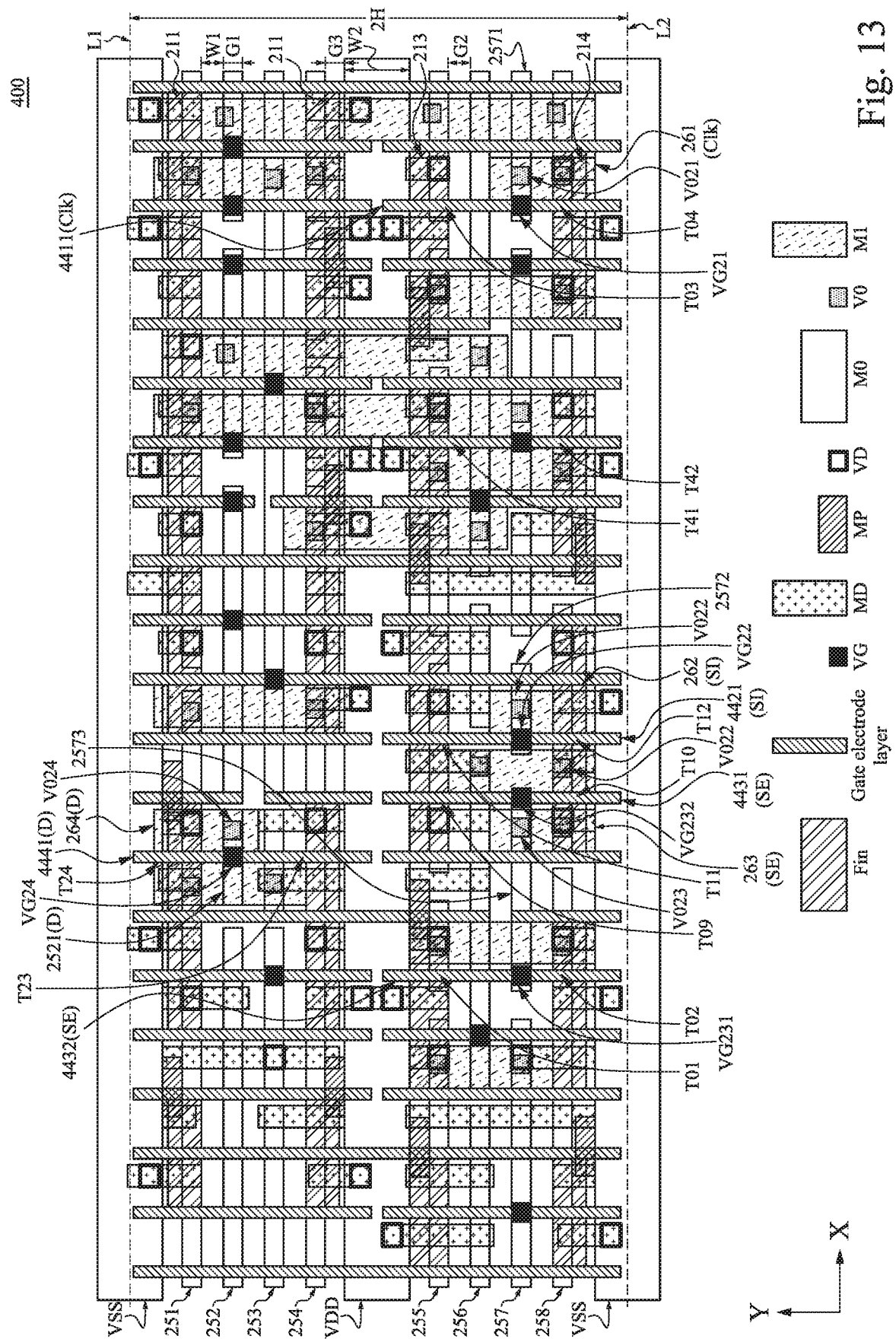
Figure 14:
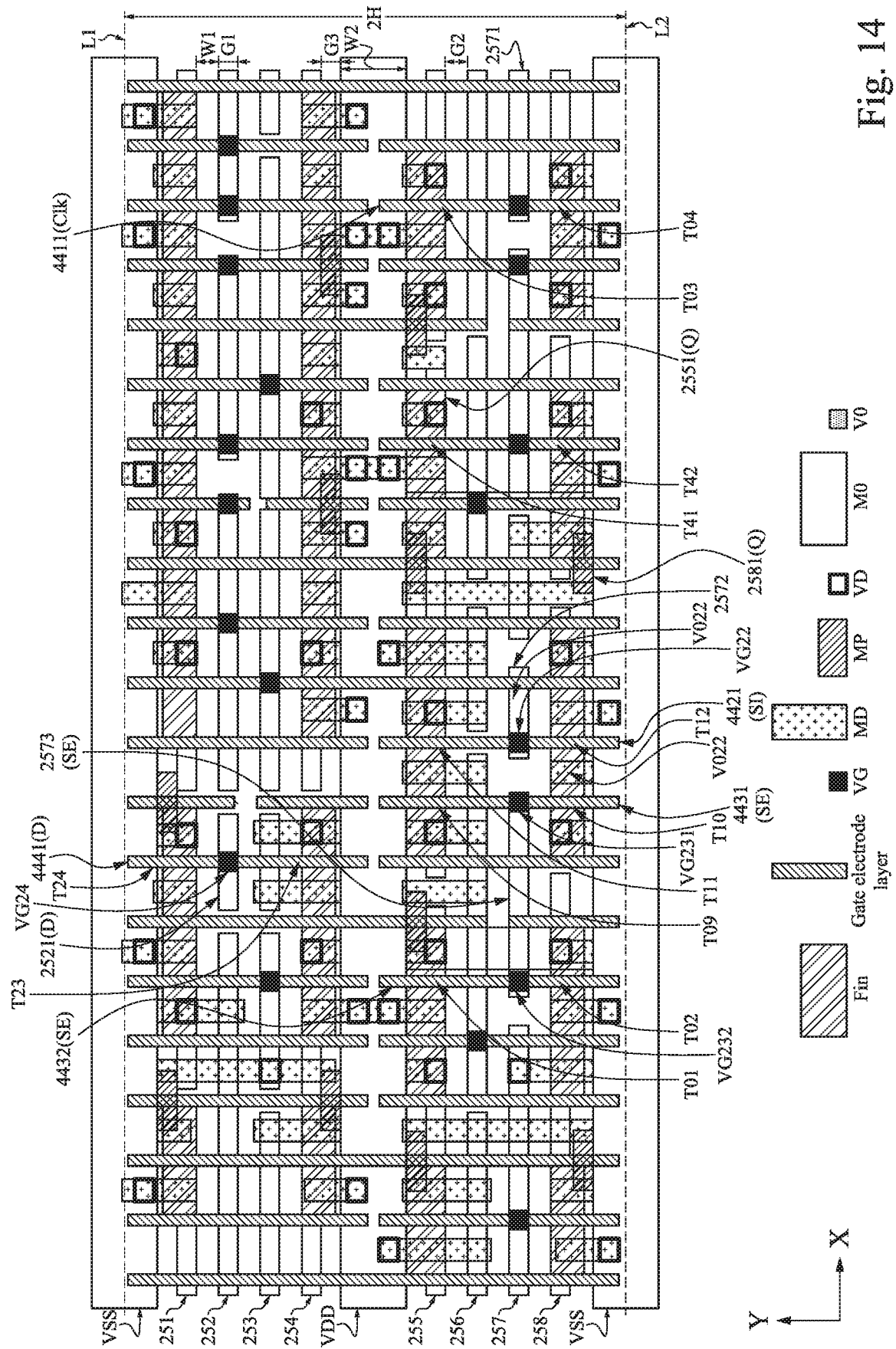
FIG. 14 shows a portion of the standard cell layout shown in FIG. 12 or FIG. 13.
Figure 15:
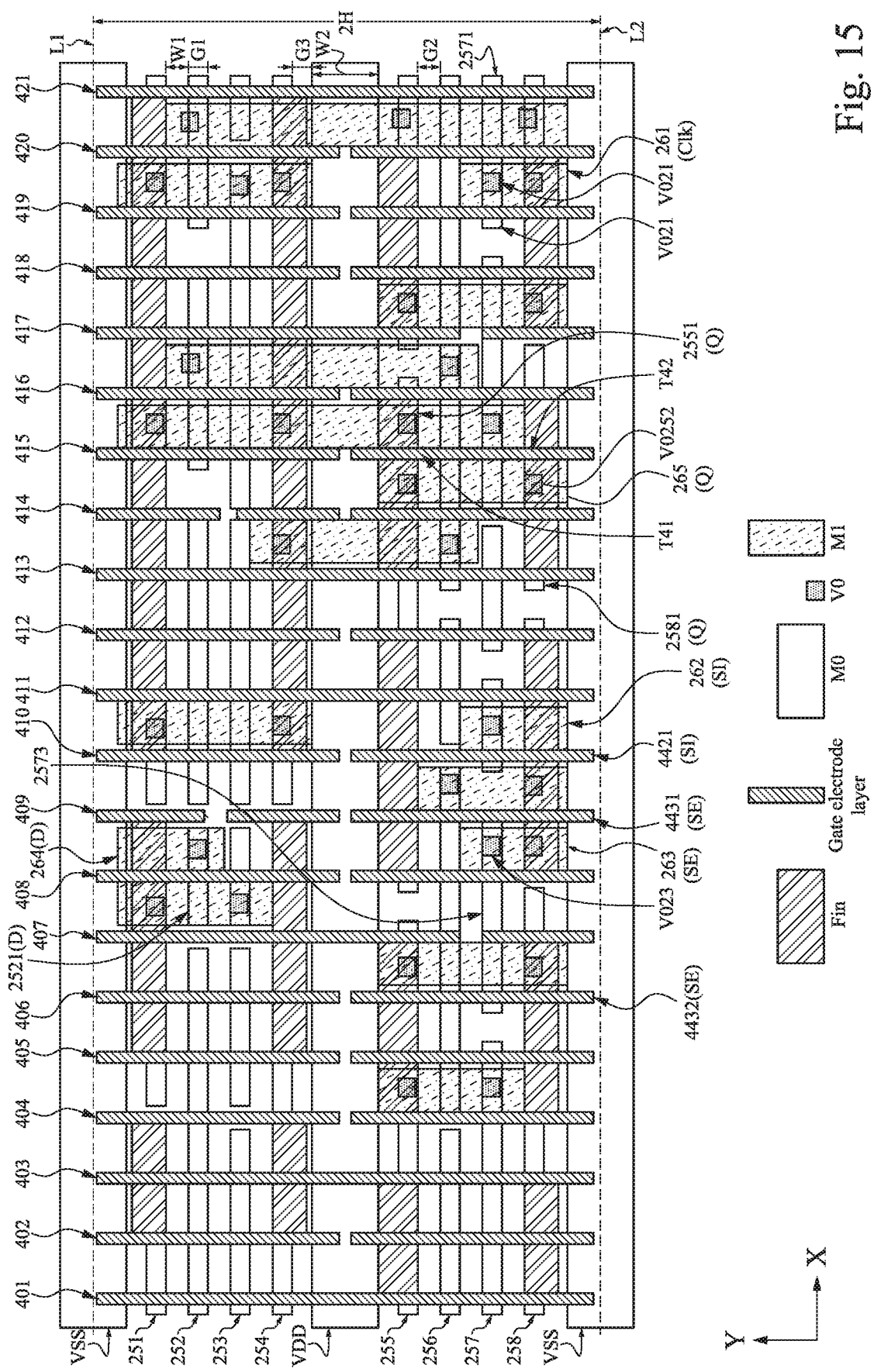
FIG. 15 shows a portion of the standard cell layout shown in FIG. 12 or FIG. 13.

FIGS. 12 and 13 show a standard cell layout of the flip-flop circuit shown in FIG. 11, according to some embodiments of the present disclosure. FIG. 14 shows a portion of the standard cell layout shown in FIG. 12 or FIG. 13. FIG. 15 shows a portion of the standard cell layout shown in FIG. 12 or FIG. 13.

For convenience of illustration, in FIGS. 12 and 13, elements of a standard cell layout 400 of a flip-flop circuit 300' shown in FIG. 11 are labeled separately, although the layouts shown in FIGS. 12 and 13 are the same as each other.

Similar to the above-described embodiments, each of FIGS. 14 and 15 shows various layers including a semiconductor fin layer (denoted by "Fin" in the drawings), a gate layer (donated by "Gate electrode layer" in the drawings), a gate contact layer (denoted by "VG" in the drawings) for electrically connecting the gate electrode layer to an upper level layer such as a local connection layer M0 (denoted by "M0" in the drawings), a fin connection layer (denoted by "MD" in the drawings) for electrically connecting source/drain regions of the semiconductor fins, a contact layer (denoted by "VD" in the drawings) for electrically connecting the fin connection layer MD to the local connection layer M0, a contact layer (denoted by "MP" in the drawings) for electrically connecting the fin connection layer MD, the local connection layer M0, a first via layer (denoted by "V0" in the drawings) for electrically connecting the local connection layer M0 to a first electrically conductive layer M1 (denoted by "M1" in the drawings), and the first electrically conductive layer M1, in some embodiments. In some embodiments, each of the local connection layer M0 and the electrically conductive layer M1 is a metal layer.

For convenience of explanation, FIGS. 14 and 15 each include a portion of the various layers shown in FIGS. 12 and 13 and some layers in FIGS. 12 and 13 are omitted. For example, FIG. 14 shows a layout including the semiconductor fin layer, the gate electrode layer, the gate contact layer VG, the fin connection layer MD, the contact layer MP, the contact layer VD, and the local connection layer M0. FIG. 15 shows a layout including the semiconductor fin layer, the gate electrode layer, the local connection layer M0, the first via layer V0, and the first electrically conductive layer M1.

Referring to FIGS. 11-15, the standard cell layout 400 of the flip-flop circuit 300' according to some embodiments of the present disclosure includes transistors T01 to T42 made of first to fourth semiconductor fins 211-214 extending substantially parallel to X direction and gate electrode layers 402-420 extending substantially parallel to Y axis.

The standard cell layout 400 also includes the wirings and contacts/vias formed of the layers including, but not limited to, those represented by "VG", "MD", "MP", "VD", "M0", "V0", and "M1" in the drawings to implement local connections so as to route signals inside the standard cell layout 400 (or flip-flop circuit 300') and/or to implement global connections for receiving the input signals such as the scan input signal SI, the scan enable signal SE, the data input signal D, and the clock signal Clk from another circuit/cell, and for outputting the data output signal Q to another circuit/cell. In some embodiments, the scan input signal SI and/or the scan enable signal SE can be omitted.

Although one reference numeral (i.e., one of 211-214) is used to represent all the semiconductor fin sections spaced apart from each other but aligned to each other in X axis, a semiconductor fin (i.e., one of semiconductor fins 211-214) refers to all the semiconductor fin sections located in the standard cell layout 400 and aligned with each other in X axis, according to some embodiments.

In some embodiments, the first to the fourth semiconductor fins 211-214 are sequentially arranged along −Y axis. The first and fourth semiconductor fins 211 and 214 disposed on edge regions of the standard cell layout 400 are configured to form first-type transistors, and the second and third semiconductor fins 212 and 213 disposed on an intermediate region between the edge regions of the standard cell layout 400 are configured to form second-type transistors.

In some embodiments, the first-type transistors are N-type transistors and the second-type transistors are P-type transistors, in a case in which electrically conductive wirings VSS used to transmit reference voltage potential such as ground are disposed on opposite edges of standard cell layout 400 in Y axis and an electrically conductive wiring VDD used to transmit voltage potential different from VSS is disposed on the intermediate region of the standard cell layout 400, as shown in the drawings. In this case, the first and fourth semiconductor fins 211 and 214 are formed in one or more first-type wells, for example, P-type wells (not shown), and thus, transistors formed based on the first and fourth semiconductor fins 211 and 214 are N-type transistors. The second and third semiconductor fins 212 and 213 are formed in one or more second-type wells, for example, N-type wells (not shown), and as such, the transistors formed based on the second and third semiconductor fins 212 and 213 are P-type transistors.

For example, referring to FIGS. 12-15, the first semiconductor fin 211 is configured to form N-type transistors including transistors T18, T20, T22, T24, T26, T28, T30, T34-1, T36, T38, T34-2, and T06 disposed sequentially along X axis, the second semiconductor fin 212 is configured to form P-type transistors including transistors T17, T19, T21, T23, T25, T27, T29, T33, T35, T37, and T05 disposed sequentially along X axis, the third semiconductor fin 213 is configured to form P-type transistors including transistors T15, T13, T01, T09, T11, T07, T31, T41, T39, and T03 disposed sequentially along X axis, and the fourth semiconductor fin 214 is configured to form N-type transistors including transistors T16, T14, T02, T10, T12, T08, T32, T42, T40, and T04 disposed sequentially along X axis. The fin field-effect transistor (FinFET) described with reference to FIG. 8 can be used to implement the transistors T01 to T42.

The present disclosure, however, is not limited to the above configuration. In other embodiments, the first-type transistors are P-type transistors and the second-type transistors are N-type transistors. In such a case, an electrically conductive wiring VSS used to transmit reference voltage potential such as ground is disposed on the intermediate region of the standard cell layout 400 and electrically conductive wirings VDD used to transmit voltage potential are disposed on opposite edge regions of the standard cell layout 400 in Y axis. In this case, the first and fourth semiconductor fins 211 and 214 are formed in one or more N-type wells (not shown), and as such, transistors formed based on the first and fourth semiconductor fins 211 and 214 are P-type transistors. The second and third semiconductor fins 212 and 213 are formed in one or more second-type wells, for example, P-type wells (not shown), and thus, the transistors formed based on the second and third semiconductor fins 212 and 213 are N-type transistors. One of ordinary skill in the art should understand that a standard cell layout according to such a configuration is different from that shown in FIG. 12 or FIG. 13. A description to modify the standard cell layout 400 will be omitted, since one of ordinary skill in the art should understand how to modify locations of the transistors T01 to T42 and wirings/contacts thereof to configure a standard cell layout in which the electrically conductive wiring VSS used to transmit ground is disposed on the intermediate region of the standard cell layout and the electrically conductive wirings VDD used to transmit voltage potential are disposed on edge regions of the standard cell layout in Y axis.

FIGS. 12-15 show two semiconductor fins 211 and 214 for forming the first-type transistors and two semiconductor fins 212 and 213 for forming the second-type transistors, but the present disclosure is not limited thereto. Although not shown in the drawings, in some embodiments, the standard cell layout 400 of the flip-flop circuit 300' can have three semiconductor fins for forming the first-type transistors and three semiconductor fins for forming the second-type transistors; in some embodiments, the standard cell layout 400 of the flip-flop circuit 300' can have three semiconductor fins for forming the first-type transistors and two semiconductor fins for forming the second-type transistors; and in some embodiments, the standard cell 400 of the flip-flop circuit 300' can have two semiconductor fins for forming the first-type transistors and three semiconductor fins for forming the second-type transistors. In some embodiments, the number of semiconductor fins can be determined based on required current driving capacities of the transistors. In some embodiments, the number of semiconductor fins forming the first-type transistors and the number of semiconductor fins forming the second-type transistors can be different from each other and can be greater than three.

In the drawings, although one reference numeral (i.e., one of 402-420) is used to represent all the gate electrode sections aligned to each other in Y axis perpendicular to X axis, a gate electrode layer (i.e., one of gate electrode layers 402-420) refers to all the gate electrode sections located aligned with each other in Y axis.

In some embodiments, the standard cell layout 400 includes first and second dummy gate electrode layers 401 and 421 extending continuously along Y axis and disposed on opposite sides of the gate electrode layers 402-420. The dummy gate electrode layers 401 and 421 and the gate electrode layers 402-420 are formed on the same layer, i.e., the layer represented by "Gate electrode layer" in the drawings. One of ordinary skill in the art should understand that a dummy gate electrode layer, unlike the gate electrode layers 402-420, can be electrically floating and can be used to improve dimensional accuracy when forming the gate electrode layers. In some embodiments, each of the dummy gate electrode layers 401 and 421 continuously extends to cross all of the semiconductor fins 211-214 in the standard cell layout 400. In some embodiments, a length of the dummy gate electrode layers 401 and 421 is equal to or greater than the longest one of the gate electrode layers 402-421. The first and second dummy gate electrode layers 401 and 421 can be configured similar to those described with reference to FIGS. 6 and 7.

Although FIGS. 12-15 show that the standard cell layout 400 includes twenty one gate electrode layers including the gate electrode layers 402-420 and the first and second dummy gate electrode layers 401 and 421, the present disclosure is not limited thereto. In some embodiments, the standard cell layout 400 of the flip-flop circuit can have more, or fewer, gate electrode layers, dependent on design particulars. In some embodiments, the gate electrode layers 402-420, together with the dummy gate electrode layers 401 and 421, are arranged with a constant pitch along X axis. In some embodiments, the gate electrode layers 402-420 and the dummy gate electrode layers 401 and 421 each has the same width in X axis.

Referring to FIGS. 12-15, the standard cell layout 400 of the flip-flop circuit 300' according to some embodiments of the present disclosure also includes a plurality of electrically conductive wirings, denoted by reference numerals 251-258, each extending substantially parallel to X axis. The plurality of electrically conductive wirings 251-258 can be formed of the same material on the same level, and include first electrically conductive wirings 251-254 disposed over an upper region between the upper electrically conductive wiring VSS and the electrically conductive wiring VDD, and second electrically conductive wirings 255-258 disposed over a lower region between the electrically conductive wiring VDD and the lower electrically conductive wiring VSS. In some embodiments, the electrically conductive wirings VDD, VSS, and 251-258 can be formed of the same electrically conductive layer, for example, the local connection layer M0.

Although one reference numeral (i.e., one of 251-258) is used to represent all the electrically conductive sections aligned to each other in X axis, an electrically conductive wiring (i.e., one of 251-258) refers to all the electrically conductive sections located in the standard cell layout 400 and aligned with each other in X axis.

In some embodiments, two or more sections, of the same electrically conductive wiring, spaced apart from each other can be used as a free wiring which may not be designated to transmit any clock signal and which, however, can be used to implement local interconnections among transistors or other electrically conductive wirings of the flip-flop circuit 400. Two or more discrete sections aligned to each other along X axis can be electrically connected to various transistors, vias, or other electrically conductive wirings on a level different from the aforementioned plurality of electrically conductive wirings 251-258. In some embodiments, one of the electrically conductive layers 251-258 can be electrically isolated from the other of the electrically conductive wirings 251-258.

Although each of the electrically conductive wirings 251-258 includes two or more sections spaced apart from each other, the present disclosure is not limited thereto. One of ordinary skill in the art should understand that one or more of the electrically conductive wirings 251-258 can be a single integral pattern extending substantially parallel to X axis. For example, an electrically conductive wiring can include a continuous pattern extending across the entire cell layout 400, and such an electrically conductive wiring can be used to connect adjacent cells in an integrated circuit.

The local connection layer M0 including the electrically conductive wirings 251-258 and the electrically conductive wirings VDD and VSS can be electrically connected to the first to fourth semiconductor fins 211-214, the gate electrode layers 402-420, and/or other electrically conductive wirings made of the first electrically conductive layer M1 on a level above the local connection layer M0, through vias/contacts (denoted by "VD" and "MD" in the drawings). Further, contacts MD can be locally connected by conductive patterns MP disposed over the contacts MD.

In some embodiments, some of the electrically conductive wirings 251-258 are free to be allocated to any signals including, but not limited to, input signals such as the scan input signal SI, and the scan enable signal SE, the data input signal D, and the clock signal Clk, and the data output signal Q.

Although the drawings show that the standard cell layout 400 includes eight electrically conductive wirings 251-258 extending substantially parallel to X axis, the present disclosure is not limited thereto. In some embodiments, the dual-height standard cell 400 can fewer electrically conductive wirings, or have more electrically conductive wirings for local or global electrical connections, dependent on design particulars. In some embodiments, the number of electrically conductive wirings is six, three of which are disposed between the upper electrically conductive wiring VSS and the electrically conductive wiring VDD and another three of which are disposed between the lower electrically conductive wiring VSS and the electrically conductive wiring VDD.

The gap/pitch/distance/height of the standard cell layout 400 shown in FIGS. 13 and 14 can be referred to those shown in FIGS. 3 and 4 and thus will not be repeated here to avoid redundancy.

In some embodiments, the standard cell layout 400 further includes the first electrically conductive layer M1 based on which electrically conductive wirings for receiving the input signals such as the scan input signal SI, the scan enable signal SE, the data input signal D, and the clock signal Clk from another cell/circuit and for outputting the data output signal Q to another cell/circuit. As shown in the drawings, the electrically conductive wirings in the first electrically conductive layer M1 extend substantially parallel to Y axis and disposed between adjacent patterns of the gate electrode layer.

Referring to the drawings, a wiring 261 (shown in FIG. 15) of the first electrically conductive layer M1 receives the input clock signal Clk from another cell or circuit through another electrically conductive wiring made of, for example, a second metal layer (not shown). The received clock signal Clk is transmitted from the wiring 261 to an electrically conductive section 2571 (shown in FIGS. 13 and 14) of the electrically conductive wiring 257 (shown in FIGS. 13-15) made of the local connection layer M0 through a via V021 (shown in FIG. 15) therebetween. The electrically conductive section 2571 transmits the clock signal Clk to a gate electrode section 4411 (shown in FIGS. 13 and 14) of the gate electrode layer 419 (shown in FIG. 15) through a via VG21 (shown in FIG. 13) therebetween. Accordingly, the clock signal Clk is transmitted to the gate electrodes of transistors T03 and T04 (shown in FIG. 13) through the gate electrode section 4411.

Referring to the drawings, in the standard cell layout 400, in the local connection layer M0, the electrically conductive wiring 257 is the only electrically conductive wiring used to transmit the clock signal Clk. Thus, the remaining wirings 251-256 and 258 can be used to route other types of signals other than the clock signal. Further, the electrically conductive wiring 257 includes the electrically conductive section 2571 configured to route the clock signal Clk and other electrically conductive sections including, but not limited to, electrically conductive wirings 2572 and 2573 configured to route the scan input signal SI and the scan input signal SE, respectively.

In some embodiments, the standard cell layout 400 of the flip-flop circuit 300' receives only one clock signal Clk which is redistributed to various transistors in the flip-flop circuit 300' through local wirings and/or contacts/vias. In some embodiments, the standard cell layout 400 of the flip-flop circuit 300' does not receive another clock signal ClkB which is complementary to the clock signal Clk.

In some embodiments, in the local connection layer M0, only one wiring or only one section of all the wirings transmits the clock signal Clk, as described above. In some embodiments, the flip-flop circuit 300' does not include any CMOS transmission gate, which uses both the clock signal Clk and the complementary clock signal ClkB.

Accordingly, the standard cell layout 400 according to embodiments of the present disclosure has more design freedom, as more wirings or more sections of the wirings are available to wire other signals, as compared to a cell layout which uses the local connection layer to transmit both the clock signal Clk and the complementary clock ClkB.

Referring to the drawings, a wiring 262 (shown in FIG. 15) of the first electrically conductive layer M1 receives the input scanning signal SI from another cell or circuit through another electrically conductive wiring made of, for example, the second metal layer (not shown). The received scan input signal SI is transmitted from the wiring 262 to an electrically conductive section 2572 (shown in FIGS. 13 and 14) of the electrically conductive wiring 257 (shown in FIGS. 13-15) made of the local connection layer M0 through a via V022 (shown in FIG. 15) therebetween. The electrically conductive section 2572 transmits the scan input signal SI to a gate electrode section 4421 (shown in FIGS. 13 and 14) corresponding to a portion of the gate electrode layer 10 (shown in FIG. 15) through a via VG22 (shown in FIG. 14) therebetween. Accordingly, the scan input signal SI is transmitted to the gate electrodes of transistors T11 and T12 (shown in FIG. 13) through the gate electrode section 4421.

Referring to the drawings, a wiring 263 (shown in FIG. 15) of the first electrically conductive layer M1 receives the input scan enable signal SE from another cell or circuit through another electrically conductive wiring made of, for example, the second metal layer (not shown). The received scan enable signal SE is transmitted from the wiring 263 to an electrically conductive section 2573 (shown in FIGS. 13 and 14) of the electrically conductive wiring 257 (shown in FIGS. 13-15) made of the local connection layer M0 through a via V023 (shown in FIG. 15) therebetween. The electrically conductive section 2573 transmits the scan enable signal SE to a gate electrode section 4431 (shown in FIGS. 13 and 14) corresponding to a portion of the gate electrode layer 9 (shown in FIG. 15) through a via VG231 (shown in FIG. 14) therebetween. Accordingly, the scan enable signal SE is transmitted to the gate electrodes of transistors T09 and T10 (shown in FIG. 13) through the gate electrode section 4431. The electrically conductive section 2573 transmits the scan enable signal SE to a gate electrode section 4432 (shown in FIGS. 13 and 14) corresponding to a portion of the gate electrode layer 406 (shown in FIG. 15) through a via VG232 (shown in FIG. 14) therebetween. Accordingly, the scan enable signal SE is transmitted to the gate electrode of transistors T01 and T02 (shown in FIG. 13) through the gate electrode section 4432.

Referring to the drawings, a wiring 264 (shown in FIG. 15) of the first electrically conductive layer M1 receives the data input signal D from another cell or circuit through another electrically conductive wiring made of, for example, the second metal layer (not shown). The received data input signal D is transmitted from the wiring 264 to an electrically conductive section 2521 (shown in FIGS. 13 and 14) of the electrically conductive wiring 252 (shown in FIGS. 13-15) made of the local connection layer M0 through a via V024 (shown in FIG. 15) therebetween. The electrically conductive section 2521 transmits the data input signal D to a gate electrode section 4411 (shown in FIGS. 13 and 14) corresponding to a portion of the gate electrode layer 8 (shown in FIG. 15) through a via VG24 (shown in FIG. 14) therebetween. Accordingly, the data input signal D is transmitted to the gate electrodes of transistors T23 and T24 (shown in FIG. 13) through the gate electrode section 4411.

Referring to the drawings, a wiring 265 (shown in FIG. 15) of the first electrically conductive layer M1 outputs the data output signal Q to another cell or circuit through another electrically conductive wiring made of, for example, the second metal layer (not shown). The output data output signal Q is transmitted from an electrically conductive section 2551 (shown in FIGS. 13 and 14) of the electrically conductive wiring 255 (shown in FIGS. 13-15) made of the local connection layer M0 through a via V0251 (shown in FIG. 15) therebetween and from an electrically conductive section 2581 (shown in FIGS. 13 and 14) of the electrically conductive wiring 258 (shown in FIGS. 13-15) made of the local connection layer M0 through a via V0252 (shown in FIG. 15) therebetween. The electrically conductive sections 2551 and 2581 receives the output data signals from drains of the transistors T41 and T42 through vias made of VD and MD therebetween.

One of ordinary skill in the art should understand that the above layout configured to receive the input signals, to transmit the output signal, and to locally route signals is merely an example. According to other embodiments, the layout to implement the flip-flop circuit 300' can be different from that shown in FIGS. 12-15, dependent on design particulars. For example, one or more of transistors T01 to T42 can be repositioned, the number of the wirings (or the wiring sections) can be increased or decreased, and the number of semiconductor fins (or the semiconductor fin sections) can be increased or decreased, the number of the gate electrode layers (or the gate electrode sections) can be increased or decreased. One of ordinary skill in the art should also understand that the location and/or number of contacts or vias for vertically connect different layers can also be changed.

In some embodiments, a flip-flop circuit without using any CMOS transmission gate (i.e., a flip-flop circuit only receives one clock signal rather than two clock signals complementary to each other), including but not limited to those shown in FIGS. 16 and 17 to be described below, can be implemented in a standard cell layout with some modification to the standard cell layout 200 or 400. A description to modify the standard cell layout 200 or 400 will be omitted, since one of ordinary skill in the art should understand how to implement transistors of such a flip-flop circuit and wirings/contacts thereof to configure a standard cell layout in which the semiconductor fins, the gate electrode layers, the local connection layer M0, the first electrically conductive layer M1, and various contacts/vias are modified based on the standard cell layout 200 or 400.

Figure 16:
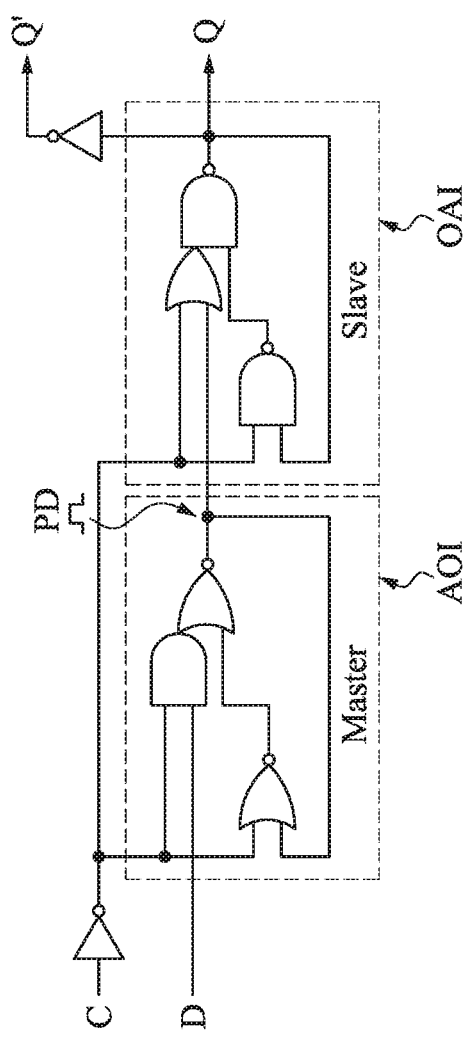
FIG. 16 shows an example of a circuit diagram of a flip-flop circuit receiving only one clock signal.
Figure 17:
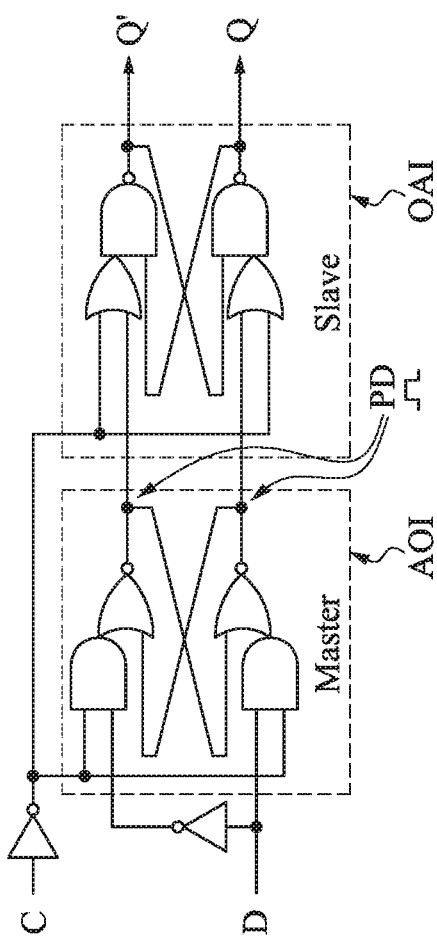
FIG. 17 shows an example of a circuit diagram of a flip-flop circuit receiving only one clock signal.

FIGS. 16 and 17 show examples of circuit diagrams of flip-flop circuits receiving only one clock signal and having no transmission gate. In some embodiments, the layout of each flip-flop circuit shown in FIGS. 16 and 17 can be implemented in the standard cell layout 200 or 400 with some modifications.

FIG. 16 shows an exemplary transmission gate free flip-flop circuit which is a master-slave flip-flop comprised of an AND-OR-Invert (AOI) logic and an OR-AND-Invert (OAI) logic. The flip-flop circuit includes a clock input terminal C receiving a clock signal Clk, an input terminal D receiving data input signal, the AOI logic converting the data input signal into a pulse signal PD synchronized by the clock signal, the OAI logic, in response to edges of the pulse signal PD and the clock signal, outputting the pulse signal PD indicative of the data signal to an output terminal Q. In some embodiments, complementary data can be output at a complementary output terminal Q'.

FIG. 17 shows an exemplary transmission gate free flip-flop circuit which is a master-slave flip-flop comprised of an AND-OR-Invert (AOI) logic and an OR-AND-Invert (OAI) logic. The flip-flop circuit includes a clock input terminal C receiving a clock signal Clk, an input terminal D receiving data input signal, the AOI logic converting the data input signal into a pulse signal PD synchronized by the clock signal, the OAI logic, in response to edges of the pulse signal PD and the clock signal, outputting the pulse signal PD indicative of the data signal to an output terminal Q. In some embodiments, complementary data can be output at a complementary output terminal Q'.

According to some embodiments, the exemplary transmission gate free flip-flop circuits are not limited to being comprised of logic circuits such as AOI logic and/or OAI logic. In some embodiments, the exemplary transmission gate free flip-flop circuits can be implemented without using AOI logic and OAI logic. For example, an exemplary transmission gate free flip-flop circuits can include a multiplexer to convert input data stream into a pulse signal synchronized by a clock signal, and one or more inverters together with other logic circuits but not including AOI logic and OAI logic, to latch the pulse signal indicative of input data stream and to output the latched data in response to the clock signal.

As described above, the aforementioned standard cell layout 200 or 400 is a standard cell layout of a flip-flop circuit, or can be modified to be standard cell layouts of other circuits. According to other embodiments, other standard cell layouts of other circuits including, but not limited to, a buffer to temporary store data and a large size combination logic circuit to process data can be created with some modification to the standard cell layout 200 or 400.

Figure 18:
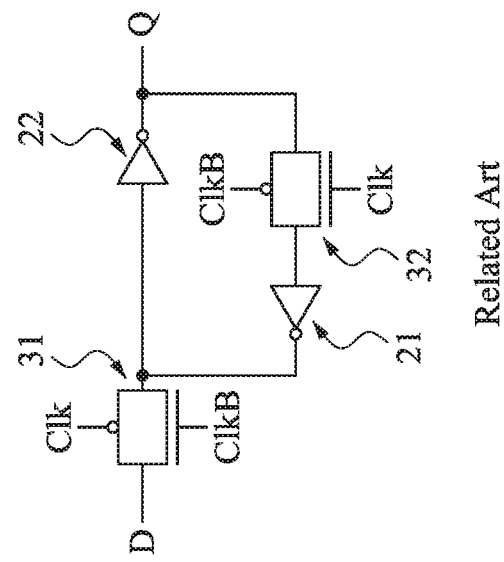
FIG. 18 shows a circuit diagram of a flip-flop circuit according to the related art.

FIG. 18 shows a circuit diagram of a flip-flop circuit according to the related art.

As shown in FIG. 18, the flip-flop circuit includes an input terminal D receiving data input signal, two cross-coupled inverters 21 and 22 storing the input data stream passing through a first transmission gate 31 in response to a clock signal Clk and another clock signal ClkB complementary to the clock signal Clk, and an output terminal Q outputting data stream stored by the two cross-coupled inverters 21 and 22 in response to the clock signal Clk and the complementary clock signal ClkB applied to a second transmission gate 32. The height of the standard cell layout of the flip-flop circuit shown in FIG. 18 is greater than a height of a standard cell layout of a flip-flop circuit similar to that shown in FIG. 18 but receiving only one type clock signal, because more electrically conductive wirings are used to implement in the standard cell layout of the flip-flop circuit shown in FIG. 18 in order to transmit the clock signals Clk and the complementary clock signal ClkB.

Figure 19:
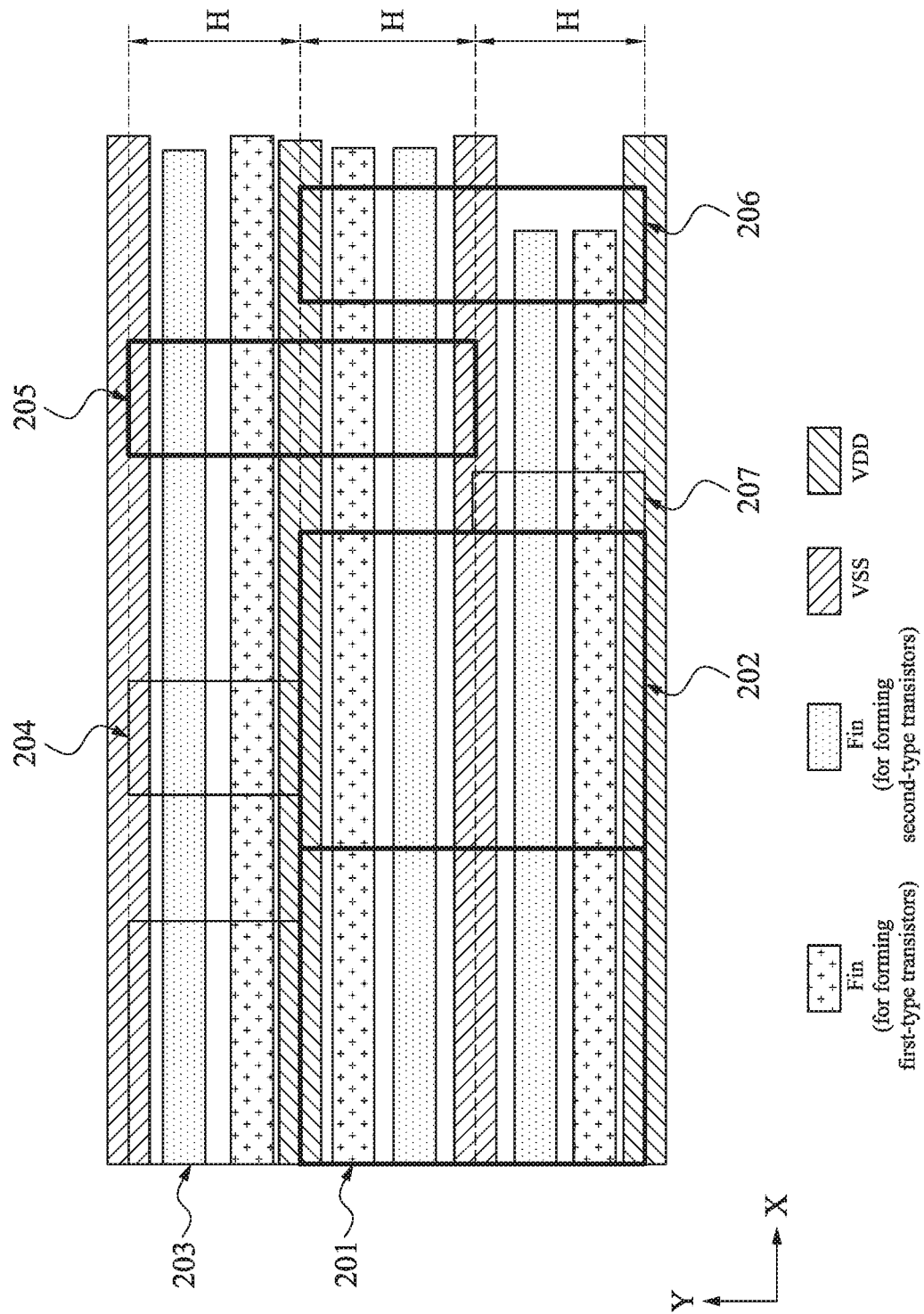
FIG. 19 shows a layout of an integrated circuit including a transmission gate (T-gate) free flip-flop, according to some embodiments of the present disclosure.

FIG. 19 shows a layout of an integrated circuit including a transmission gate (T-gate) free flip-flop, according to some embodiments of the present disclosure.

For convenience, in a height H representing a height of a standard cell, only two continuous semiconductor fins, one for forming the first-type transistors and the other for forming the second-type transistors, are shown. One of ordinary skill in the art should recognize that more semiconductor fins including one or more dummy fins can be implemented in each cell in accordance with the aforementioned embodiments described with reference to FIGS. 2-5 and/or FIGS. 12-15. The semiconductor fin can include a single continuous fin extending substantially parallel to X axis or a plurality of sections spaced apart from each other and aligned with each in X axis. One of ordinary skill should understand that in two immediately adjacent cells in Y axis, the semiconductor fins for implementing the same type of transistors are configured to be immediately adjacent to each other.

Each cell shown in FIG. 19 includes electrically conductive wirings VDD, VSS, and other electrically conductive wirings (not shown) arranged to be spaced apart from each other in Y axis and a plurality of gate electrodes (not shown) arranged to be spaced apart from each other in X axis, similar to those described with reference to FIGS. 2-5 and/or FIGS. 12-15. To avoid redundancy, a description thereof will be omitted.

As shown in FIG. 19, a layout of an integrated circuit can include a plurality of standard cell layouts 201-207 having mixed heights including height H and dual-height 2H. One or more of the standard cells 201, 202, and 205 can be a transmission gate (T-gate) free flip-flop having a layout the same as the layout 200 shown in FIG. 2 or FIG. 3 or the layout 400 shown in FIG. 12 or FIG. 13, or having a modified layout based on the layout 200 or 400 according to some embodiments. Other exemplary standard cells 203, 204, and 207 can one or more standard cells having the height H and including, but not limited to, an AND gate, an OR gate, an XOR gate, a NOT gate, a NAND gate, a NOR gate, an XNOR gate, a multiplexer, an adder, and a counter. In some embodiments, one of the standard cells 203, 204, and 207 can be a single-height cell implemented with a flip-flop circuit without transmission gate. The integrated circuit also includes the dual-height standard cell 206 such as a large size buffer combination logic circuit cell or a flip-flop circuit. The dual-height standard cell 206 can include various logic gates and/or transistors for processing signals/data. Boundaries among the cells shown in FIG. 19 can be configured in a similar manner as that shown in either FIG. 6 or FIG. 7. The present disclosure, however, is not limited thereto.

According to one aspect of the present disclosure, a standard cell layout of a transmission gate free flip-flop circuit or a standard cell layout of a flip-flop circuit receiving only one clock signal uses, for example, only one wiring in one electrically conductive layer such as a local connection layer to transmit the clock signal to one or more first-type transistors and one or more second-type transistors. The standard cell layout of a transmission gate free flip-flop circuit or the standard cell layout of a flip-flop circuit receiving only one clock signal uses does not use any metal wiring to transmit a complementary signal. As such, fewer electrically conductive wirings are used. Thus, a height of the standard cell layout of the transmission gate free flip-flop circuit or a height of the standard cell layout of a flip-flop circuit receiving only one clock signal is reduced, as compared to a standard cell of a flip-flop circuit including a transmission gate or receiving complementary clock signals. Thus, more cells or transistors can be integrated in an integrated circuit, when the standard cell layout of the transmission gate free flip-flop circuit or the standard cell layout of the flip-flop circuit receiving only one clock signal, rather than the standard cell layout of the flip-flop circuit including a transmission gate or the standard cell layout of the flip-flop circuit receiving complementary clock signals, is selected to implement an integrated circuit.

According to one aspect of the present disclosure, a standard cell layout of a transmission gate free flip-flop circuit or a standard cell layout of a flip-flop circuit receiving only one clock signal can have more electrically conductive wirings as free electrically conductive wirings in one electrically conductive layer such as a local connection layer, as compared to a standard cell of a flip-flop circuit including a transmission gate or receiving complementary clock signals, such that congestions in routing can be mitigated.

According to one aspect of the present disclosure, the flip-flip circuit without transmission gate can generate a pulse-like control signal using logic synchronized by a clock signal, have a cross-loop control using the generated pulse-like control signal to store data, and a final output stage outputting the stored data to be used in other cells/circuit.

Since the flip-flip circuit without transmission gate uses fewer togging devices as compared to a flip-flop with transmission gate, less power is consumed. In a case in which a supplied voltage is lowered, the flip-flop without transmission gate has better performance as compared to a flip-flop using transmission gate when operating at the lowered voltage.

In the aforementioned exemplary embodiments, a standard cell layout of a transmission gate free flip-flop circuit or a standard cell layout of a flip-flop circuit receiving only one clock signal is described. The present disclosure, however, is not limited thereto. One of ordinary skill in the art should appreciate that a standard cell layout of another circuit including only one type of clock signal can also be created, at least based on the aforementioned height reduction principle by using semiconductor fins and by using fewer electrically conductive layers on a same level to transmit a clock signal and/or the aforementioned principle to simply the structure and/or process by not forming a cut in a gate electrode layer.

One of ordinary skill in the art shall understand the standard cell layout according to various embodiments of the present disclosure can be stored in a design library in which various of other standard cells are saved, such that a layout design can select the standard cell according to embodiments of the present disclosure, together with other standard cells from the design library to design a layout of an integrated circuit.

In one embodiment, a semiconductor standard cell of a flip-flop circuit includes a plurality of semiconductor fins extending substantially parallel to each other along a first direction, a plurality of electrically conductive wirings disposed on a first level and extending substantially parallel to each other along the first direction, and a plurality of gate electrode layers extending substantially parallel to a second direction substantially perpendicular to the first direction and formed on a second level different from the first level. The flip-flop circuit includes a plurality of transistors made of the plurality of semiconductor fins and the plurality of gate electrode layers, receives a data input signal, stores the data input signal, and outputs a data output signal indicative of the stored data in response to a clock signal, the clock signal is the only clock signal received by the semiconductor standard cell, and the data input signal, the clock signal, and the data output signal are transmitted among the plurality of transistors through at least the plurality of electrically conductive wirings. In one embodiment, the plurality of electrically conductive wirings include a first electrically conductive wiring transmitting the clock signal. In one embodiment, wherein the first electrically conductive wiring is the only electrically conductive wiring on the first level that transmits the clock signal. In one embodiment, the first electrically conductive wiring includes a first section transmitting the clock signal and a second section transmitting a signal different from the clock signal, and the first and second sections are spaced-apart from each other and aligned with each other along the first direction. In one embodiment, the plurality of gate electrode layers include a first gate electrode layer electrically connected to the first electrically conductive wiring and extending across one or more of the plurality of semiconductor fins. In one embodiment, the first gate electrode layer continuously extends to cross two or more of the plurality of semiconductor fins, and one or more N-type transistors and one or more P-type transistors are made of the two or more of the plurality of semiconductor fins. In one embodiment, the first gate electrode layer continuously extends to cross each of the plurality of semiconductor fins. In one embodiment, the plurality of electrically conductive wirings include first and second power wirings transmitting a first voltage potential, and a third power wiring disposed between the first and second power wirings and transmitting a second voltage potential different from the first voltage potential. In one embodiment, a number of electrically conductive wirings of the plurality of electrically conductive wirings between the first and third power wirings is three or four, and a number of electrically conductive wirings of the plurality of electrically conductive wirings between the second and third power wirings is three or four. In one embodiment, a number of semiconductor fins of the plurality of semiconductor fins between the first and third power wirings is two or three, and a number of semiconductor fins of the plurality of semiconductor fins between the second and third power wirings is two or three. In one embodiment, electrically conductive wirings of the plurality of electrically conductive wirings other than the first to third power wirings have a constant pitch. In one embodiment, a width of the first to third power metal wirings is greater than a width of the electrically conductive wirings other than the first to third power wirings. In one embodiment, the semiconductor standard cell further includes a plurality of upper metal wirings disposed on a second level above the first level, with reference to a substrate from which the flip-flop circuit is made, and the plurality of upper electrically conductive wirings extend substantially parallel to the second direction, and transmit the data input signal, the clock signal, and the data output signal with the plurality of electrically conductive wirings. In one embodiment, the plurality of gate electrode layers include a first dummy gate electrode layer and a second dummy gate electrode layer, gate electrode layers of the plurality of gate electrode layers other than the first and second dummy gate electrode layers are disposed between the first and second dummy gate electrode layer, and each of the first dummy gate electrode layer and the second dummy gate electrode layer extends continuously to cross the plurality of semiconductor fins.

In one embodiment, a semiconductor standard cell of a flip-flop circuit includes a plurality of semiconductor fins extending substantially parallel to each other along a first direction, a plurality of electrically conductive wirings disposed on a first level and extending substantially parallel to each other along the first direction, and a plurality of gate layers extending substantially parallel to a second direction substantially perpendicular to the first direction and formed on a second level different from the first level. The flip-flop circuit includes a plurality of transistors implementing at least an AND-OR-Invert (AOI) logic or an OR-AND-Invert (OAI) logic receiving an input data signal and a clock signal, a storage block storing the input data signal, and an output block outputting a data output signal indicative of the stored data. The clock signal is the only clock signal received by the semiconductor standard cell. The data input signal, the clock signal, and the data output signal are transmitted among the plurality of transistors at least through the plurality of electrically conductive wirings. In one embodiment, the plurality of electrically conductive wirings include a first electrically conductive wiring transmitting the clock signal. In one embodiment, the first electrically conductive wiring is the only electrically conductive wiring on the first level that transmits the clock signal.

In one embodiment, an integrated circuit includes a first semiconductor standard cell of a flip-flop circuit and a second semiconductor standard cell immediately adjacent to each other in a first direction. In one embodiment, the first semiconductor standard cell includes a plurality of semiconductor fins extending substantially parallel to each other along a first direction, a plurality of electrically conductive wirings disposed on a first level and extending substantially parallel to each other along the first direction, and a plurality of gate electrode layers extending substantially parallel to a second direction substantially perpendicular to the first direction and formed on a second level different from the first level. In one embodiment, the flip-flop circuit includes a plurality of transistors made of the plurality of semiconductor fins and the plurality of gate electrode layers, receives a data input signal, stores the data input signal, and outputs a data output signal indicative of the stored data in response to a clock signal, the clock signal is the only clock signal received by the first semiconductor standard cell, and the data input signal, the clock signal, and the data output signal are transmitted among the plurality of transistors through at least the plurality of electrically conductive wirings. The first semiconductor standard cell and the second semiconductor standard cell includes one or more dummy gate electrodes disposed on a boundary of the first semiconductor standard cell and the second semiconductor standard cell, and at least one of the one or more dummy gate electrodes extends continuously to cross the plurality of semiconductor fins. In one embodiment, a number of the one or more dummy gate electrodes is one. In one embodiment, a number of the one or more dummy gate electrodes is two.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor standard cell of a flip-flop circuit, the semiconductor standard cell comprising:
    semiconductor fins extending substantially parallel to each other along a first direction;
    lower electrically conductive wirings disposed on a first level and extending substantially parallel to each other along the first direction;
    gate electrode layers extending substantially parallel to a second direction substantially perpendicular to the first direction and disposed on a second level different from the first level; and
    upper electrically conductive wirings disposed on a third level above the first level, with reference to the semiconductor fins, and extending substantially parallel to each other along the second direction,
    wherein the flip-flop circuit includes transistors made of the semiconductor fins and the gate electrode layers, receives a data input signal, stores the data input signal, and outputs a data output signal indicative of the stored data in response to a clock signal, and
    only one of the upper electrically conductive wirings receives the clock signal.

2. The semiconductor standard cell of claim 1, wherein the lower electrically conductive wirings include a first electrically conductive wiring receives the clock signal from the only one of the upper electrically conductive wirings.

3. The semiconductor standard cell of claim 2, wherein the first electrically conductive wiring is the only electrically conductive wiring on the first level that transmits the clock signal.

4. The semiconductor standard cell of claim 2, wherein:
    the first electrically conductive wiring includes a first section transmitting the clock signal and a second section transmitting a signal different from the clock signal, and
    the first and second sections are spaced-apart from each other and aligned with each other along the first direction.

5. The semiconductor standard cell of claim 2, wherein the gate electrode layers include a first gate electrode layer electrically connected to the first electrically conductive wiring and extending across one or more of the semiconductor fins.

6. The semiconductor standard cell of claim 5, wherein:
    the first gate electrode layer continuously extends to cross two or more of the semiconductor fins, and
    one or more N-type transistors and one or more P-type transistors are made of the two or more of the semiconductor fins.

7. The semiconductor standard cell of claim 5, wherein the first gate electrode layer continuously extends to cross each of the semiconductor fins.

8. The semiconductor standard cell of claim 1, wherein the lower electrically conductive wirings include first and second power wirings transmitting a first voltage potential, and a third power wiring disposed between the first and second power wirings and transmitting a second voltage potential different from the first voltage potential, and
    the remaining wirings of the lower electrically conductive wirings other than the first to third power wirings are disposed between the first and third power wirings and between the second and third power wirings.

9. The semiconductor standard cell of claim 8, wherein the number of electrically conductive wirings of the lower electrically conductive wirings between the first and third power wirings is three or four, and the number of electrically conductive wirings of the lower electrically conductive wirings between the second and third power wirings is three or four.

10. The semiconductor standard cell of claim 8, wherein the number of semiconductor fins of the semiconductor fins between the first and third power wirings is two or three, and the number of semiconductor fins of the semiconductor fins between the second and third power wirings is two or three.

11. The semiconductor standard cell of claim 1, wherein:
    the gate electrode layers include a first dummy gate electrode layer and a second dummy gate electrode layer,
    gate electrode layers of the gate electrode layers other than the first and second dummy gate electrode layers are disposed between the first and second dummy gate electrode layer, and each of the first dummy gate electrode layer and the second dummy gate electrode layer extends continuously to cross the semiconductor fins.

12. A semiconductor standard cell of a flip-flop circuit, the semiconductor standard cell comprising:
- semiconductor fins extending substantially parallel to each other along a first direction;
- electrically conductive wirings disposed on a first level and extending substantially parallel to each other along the first direction; and
- gate electrode layers extending substantially parallel to a second direction substantially perpendicular to the first direction and formed on a second level different from the first level,
- wherein the flip-flop circuit includes transistors made of the semiconductor fins to implement at least an AND-OR-Invert (AOI) logic or an OR-AND-Invert (OAI) logic receiving an input data signal and a clock signal, a storage block storing the input data signal, and an output block outputting a data output signal indicative of the stored data,
- the clock signal is the only clock signal received by the AOI logic or the OAI logic, and
- the data input signal, the clock signal, and the data output signal are transmitted among the transistors at least through the electrically conductive wirings.

13. The semiconductor standard cell of claim 12, wherein the electrically conductive wirings include a first electrically conductive wiring transmitting the clock signal.

14. The semiconductor standard cell of claim 13, wherein the first electrically conductive wiring is the only electrically conductive wiring on the first level that transmits the clock signal.

15. A semiconductor standard cell, comprising:
- semiconductor fins extending substantially parallel to each other along a first direction;
- metal wirings extending substantially parallel to each other along the first direction and disposed on a first level;
- gate layers extending along a second direction substantially perpendicular to the first direction and disposed on a second level different from the first level;
- transistors made of the semiconductor fins and the gate electrode layers, receiving a data input signal, storing the data input signal, and outputting a data output signal indicative of the stored data in response to a clock signal,
- wherein the semiconductor cell is a transmission gate free flip-flop cell and receives only one clock signal; and
- one of an AND-OR-Invert (AOI) logic and an OR-AND-Invert (OAI) logic receiving the clock signal.

16. The semiconductor standard cell of claim 15, further comprising a pair of dummy gate layers disposed on opposite sides of the gate layers,
- wherein the pair of dummy gate layers and the gate layers are formed of a same material on the second level, and
- each dummy gate layer continuously extends across the semiconductor fins and is electrically floating.

17. The semiconductor standard cell of claim 15, wherein the metal wirings include first and second power wirings transmitting a first voltage potential, and a third power wiring disposed between the first and second power wirings and transmitting a second voltage potential different from the first voltage potential, and
- the remaining wirings of the metal wirings other than the first to third power wirings are disposed between the first and third power wirings and between the second and third power wirings.

18. The semiconductor standard cell of claim 17, wherein the number of wirings of the metal wirings between the first and third power wirings is three or four, and the number of wirings of the metal wirings between the second and third power wirings is three or four.

19. The semiconductor standard cell of claim 17, wherein the number of the semiconductor fins between the first and third power wirings is two or three, and the number of the semiconductor fins between the second and third power wirings is two or three.

20. The semiconductor standard cell of claim 15, wherein one of the gate layers continuously extends to cross two or more of the semiconductor fins.

\* \* \* \* \*